US012704389B2

(12) United States Patent
Fujiwara

(10) Patent No.: US 12,704,389 B2
(45) Date of Patent: Aug. 11, 2026

(54) MEASUREMENT METHOD AND MEASUREMENT SYSTEM

(71) Applicant: Tokyo Electron Limited, Tokyo (JP)

(72) Inventor: Hikaru Fujiwara, Miyagi (JP)

(73) Assignee: TOKYO ELECTRON LIMITED, Toyko (JP)

( * ) Notice: Subject to any disclaimer, the term of this patent is extended or adjusted under 35 U.S.C. 154(b) by 181 days.

(21) Appl. No.: 18/652,060

(22) Filed: May 1, 2024

(65) Prior Publication Data

US 2024/0280383 A1 Aug. 22, 2024

Related U.S. Application Data

(63) Continuation of application No. PCT/JP2022/040518, filed on Oct. 28, 2022.

(30) Foreign Application Priority Data

Nov. 1, 2021 (JP) ................................ 2021-178566

(51) Int. Cl.
*G01D 5/24* (2006.01)
*C23C 16/26* (2006.01)
(Continued)

(52) U.S. Cl.
CPC ............... *G01D 5/24* (2013.01); *C23C 16/26* (2013.01); *C23C 16/505* (2013.01); *C23C 16/52* (2013.01);
(Continued)

(58) Field of Classification Search
CPC ........ G01D 5/24; C23C 16/26; C23C 16/505; C23C 16/52; G01B 11/27; G01B 7/00;
(Continued)

(56) References Cited

U.S. PATENT DOCUMENTS

2002/0148130 A1* 10/2002 Ohtsuka ................. G01B 5/207 33/552
2002/0162239 A1* 11/2002 Mitterreiter .......... G01D 5/3473 33/534
(Continued)

FOREIGN PATENT DOCUMENTS

JP 2018-181458 A 11/2018
JP 2019-096757 A 6/2019

OTHER PUBLICATIONS

International Search Report and Written Opinion mailed on Dec. 20, 2022, received for PCT Application PCT/JP2022/040518, filed on Oct. 28, 2022, 9 pages including English Translation.

*Primary Examiner* — Raul J Rios Russo
(74) *Attorney, Agent, or Firm* — XSENSUS LLP

(57) ABSTRACT

A measurement method according to an exemplary embodiment acquires a measured value indicating a capacitance between a measuring instrument and an edge ring in a chamber. The measuring instrument includes a base substrate and a sensor electrode provided on the base substrate. The method includes holding, on a stage in the chamber, the edge ring having a conductive film formed on a surface thereof. The method includes transporting the measuring instrument to a region on the stage which is surrounded by the edge ring. The method includes acquiring the measured value indicating the capacitance between the measuring instrument and the edge ring having the conductive film by using the measuring instrument transported to the inner side of the region.

20 Claims, 12 Drawing Sheets

(51) Int. Cl.
*C23C 16/505* (2006.01)
*C23C 16/52* (2006.01)
*G01B 11/27* (2006.01)
*H01J 37/32* (2006.01)

(52) U.S. Cl.
CPC ........ *G01B 11/27* (2013.01); *H01J 37/32642* (2013.01); *H01J 2237/24564* (2013.01); *H01J 2237/24578* (2013.01); *H01J 2237/3321* (2013.01)

(58) Field of Classification Search
CPC ..... G01B 7/14; G01B 7/004; H01J 37/32642; H01J 2237/24564; H01J 2237/24578; H01J 2237/3321; H01L 21/3065; H01L 21/31; H01L 21/67259; H01L 21/68; H01L 21/68735; G01R 27/2605; G06F 3/0428; G06F 3/044; G06F 3/0441; G06F 3/0442; G06F 3/0443; G06F 3/0444; G06F 3/0445; G06F 3/0446; G06F 3/0447; G06F 3/0448
USPC ........................................................ 324/686
See application file for complete search history.

(56) References Cited

U.S. PATENT DOCUMENTS

2004/0011128 A1* 1/2004 Gundlach ............. G01F 23/266 73/304 C
2010/0292946 A1* 11/2010 Tamai .................. G01B 21/042 33/502
2013/0321821 A1* 12/2013 Suzuki ............... G01B 9/02056 356/497
2016/0138956 A1* 5/2016 Griessbaum ........ G01F 23/2845 73/292

* cited by examiner

100
102
ESC
104
143
P1a
P2a
F
P2b
ER
P2
ER1
P1

W1
ESC
F
P1a
P2a
F
P2b
P2
P1

MEASUREMENT METHOD AND MEASUREMENT SYSTEM

CROSS-REFERENCE TO RELATED APPLICATIONS

This application is a bypass continuation application of international application No. PCT/JP2022/040518 having an international filing date of Oct. 28, 2022 and designating the United States, the international application being based upon and claiming the benefit of priority from Japanese Patent Application No. 2021-178566, filed on Nov. 1, 2021, the entire contents of each are incorporated herein by reference.

TECHNICAL FIELD

Exemplary embodiments of the present disclosure relate to a measurement method and a measurement system.

BACKGROUND

Patent Document 1 discloses a method of determining a misalignment amount of a central position of a measuring instrument, which is disposed in a region surrounded by an edge ring, with respect to a central position of the region.

CITATION LIST

Patent Documents

Patent Document 1: JP2019-096757A

SUMMARY

The present disclosure provides a technique of using a measuring instrument to measure a capacitance between the measuring instrument and an edge ring.

In one exemplary embodiment, a measurement method of acquiring a measured value indicating a capacitance between a measuring instrument and an edge ring in a chamber of a processing system is provided. The processing system includes a process module, a transport device, and a controller. The process module has a chamber body that provides a chamber. The process module has a stage provided in the chamber. A measuring instrument is placed on the stage. The transport device transports the measuring instrument into the chamber. The controller controls an operation of the transport device. The measuring instrument includes a base substrate and sensor electrodes. The base substrate has a disc shape. The sensor electrodes are provided on the base substrate. The method includes holding an edge ring on the stage. The method includes transporting the measuring instrument to a region on the stage which is surrounded by the edge ring. The method includes using the measuring instrument transported to the inner side of the region to acquire measured values indicating a capacitance between the measuring instrument and the edge ring, the edge ring having a conductive film. The edge ring to be held on the stage includes an edge ring body and a conductive film. The conductive film is formed on at least a part of a surface of the edge ring body and is different from the edge ring body in composition.

According to the measuring instrument of one exemplary embodiment, the capacitance between the measuring instrument and the edge ring can be measured.

BRIEF DESCRIPTION OF DRAWINGS

FIG. 5 is a plan view illustrating the exemplary measuring instrument as viewed from a lower surface side.

FIG. 6 is a perspective view illustrating an example of a first sensor in the measuring instrument.

FIG. 9 is a diagram illustrating an example of a configuration of a circuit substrate in the measuring instrument.

DETAILED DESCRIPTION

Figure 1:
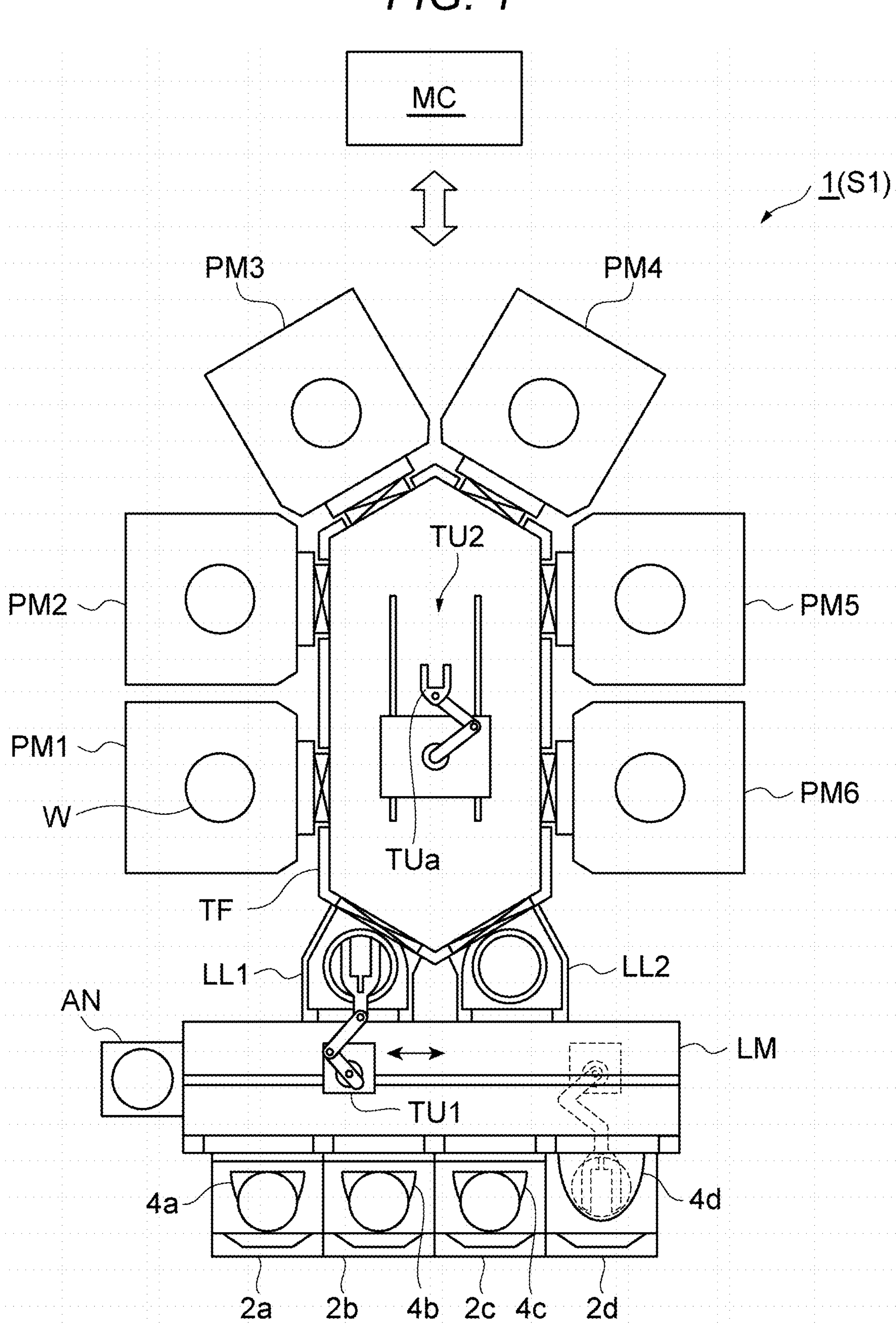
FIG. 1 is a diagram illustrating a processing system.

Hereinafter, various exemplary embodiments will be described.

In one exemplary embodiment, a measurement method of acquiring a measured value indicating a capacitance between a measuring instrument and an edge ring in a chamber of a processing system is provided. The processing system includes a process module, a transport device, and a controller. The process module has a chamber body that provides a chamber. The process module has a stage provided in the chamber. A measuring instrument is placed on the stage. The transport device transports the measuring instrument into the chamber. The controller controls an operation of the transport device. The measuring instrument includes a base substrate and sensor electrodes. The base substrate has a disc shape. The sensor electrodes are provided on the base substrate. The method includes holding an edge ring on the stage. The method includes transporting the measuring instrument to a region on the stage which is surrounded by the edge ring. The method includes using the measuring instrument transported to the inner side of the region to acquire measured values indicating a capacitance between the measuring instrument and the edge ring, the edge ring having a conductive film. The edge ring to be held on the stage includes an edge ring body and a conductive film. The conductive film is formed on at least a part of a surface of the edge ring body and is different from the edge ring body in composition.

In one exemplary embodiment, a measurement system is provided that acquires a measured value indicating capacitance between a measuring instrument and an edge ring in a chamber of a processing system. The measuring instrument includes a base substrate, sensor electrodes, and an arithmetic unit. The base substrate has a disc shape. The sensor electrodes are provided on the base substrate to face outward in a radial direction. Based on digital values output from an A/D converter, the arithmetic unit calculates measured values indicating capacitances respectively formed by the sensor electrodes. The processing system includes a process module, a transport device, and a controller. The process module has a chamber body that provides a chamber. The process module has a stage provided in the chamber. A measuring instrument is placed on the stage. The transport device transports the measuring instrument into the chamber. The controller controls an operation of the transport device. An edge ring is held on the stage. The controller controls the transport device to transport the measuring instrument to a region on the stage which is surrounded by the edge ring. The arithmetic unit calculates measured values indicating capacitances between the sensor electrodes of the measuring instrument transported to the inner side of the region and the edge ring having a conductive film. The edge ring includes an edge ring body and the conductive film. The conductive film is formed on at least a part of a surface of the edge ring body and is different from the edge ring body in composition.

In the measurement method and the measurement system of the embodiment described above, measured values indicating capacitances corresponding to distances between the sensor electrodes of the measuring instrument transported to the region surrounded by the edge ring and the edge ring are acquired by the measuring instrument. Since the surface of the edge ring body has the conductive film, when the sensor electrodes and the conductive film of the edge ring face each other, the measured values indicating the capacitances are appropriately acquired.

In one exemplary embodiment, the edge ring body may be formed of an insulator.

In one exemplary embodiment, the conductive film may contain a carbon atom.

In one exemplary embodiment, the holding the edge ring on the stage may include placing the edge ring body on the stage and forming the conductive film on the surface of the edge ring body placed on the stage.

In one exemplary embodiment, the forming the conductive film may be forming the conductive film by CVD.

In one exemplary embodiment, the CVD may be plasma CVD.

In one exemplary embodiment, the forming the conductive film may be forming the conductive film by a plasma of a hydrocarbon gas, a hydrofluorocarbon gas, a fluorocarbon gas, or a gas including combinations thereof.

In one exemplary embodiment, the method may include, before the forming the conductive film, placing a covering member on the region surrounded by the edge ring body on the stage. Further, the method may include, after the forming the conductive film, removing the covering member from the region surrounded by the edge ring on the stage.

In one exemplary embodiment, the method may further include, after the acquiring the measured values, removing the conductive film by a plasma containing an oxygen atom.

In one exemplary embodiment, the conductive film may be formed at least on a portion of the edge ring body that faces the sensor electrodes of the measuring instrument.

In one exemplary embodiment, the method may further include, after the acquiring the measured values, adjusting a transport position of the transport device based on the measured values.

In one exemplary embodiment, the measuring instrument may include a radio frequency oscillator, C/V conversion circuits, an A/D converter, and an arithmetic unit. The radio frequency oscillator is provided to supply a radio frequency signal to the sensor electrodes. The C/V conversion circuits generate voltage signals corresponding to the respective capacitances formed by the respective sensor electrodes. The A/D converter converts voltage signals output from the respective C/V conversion circuits into digital values, respectively. Based on digital values output from an A/D converter, the arithmetic unit calculates measured values indicating capacitances respectively formed by the sensor electrodes.

Hereinafter, various exemplary embodiments will be described in detail with reference to the drawings. Further, like reference numerals will be given to like or corresponding parts throughout the drawings.

First, a processing system that includes a processing apparatus for processing a workpiece and a transport device for transporting the workpiece to the processing apparatus will be described. FIG. 1 is a diagram illustrating the processing system. A processing system 1 has a function as a semiconductor manufacturing apparatus Si. The processing system 1 is provided with stages 2a to 2d, containers 4a to 4d, a loader module LM, an aligner AN, load-lock modules LL1 and LL2, process modules PM1 to PM6, a transfer module TF, and a controller MC. The number of stages 2a to 2d, the number of containers 4a to 4d, the number of load-lock modules LL1 and LL2, and the number of process modules PM1 to PM6 are not limited, and may be any number of one or more.

The stages 2a to 2d are arranged along one side of a loader module LM. The containers 4a to 4d are placed on the stages 2a to 2d, respectively. Each of the containers 4a to 4d is, e.g., a container referred to as Front Opening Unified Pod (FOUP). Each of the containers 4a to 4d may be configured to accommodate a workpiece W. The workpiece W has an approximate disc shape like a wafer.

The loader module LM has a chamber wall defining in an inside thereof a transport space in an atmospheric pressure state. A transport device TU1 is provided in the transport space. The transport device TU1 is, for example, an articulated robot and is controlled by the controller MC. The transport device TU1 is configured to transport the workpiece W between the containers 4a to 4d and the aligner AN, between the aligner AN and the load-lock modules LL1 to LL2, and between the load-lock modules LL1 to LL2 and the containers 4a to 4d.

Figure 2:
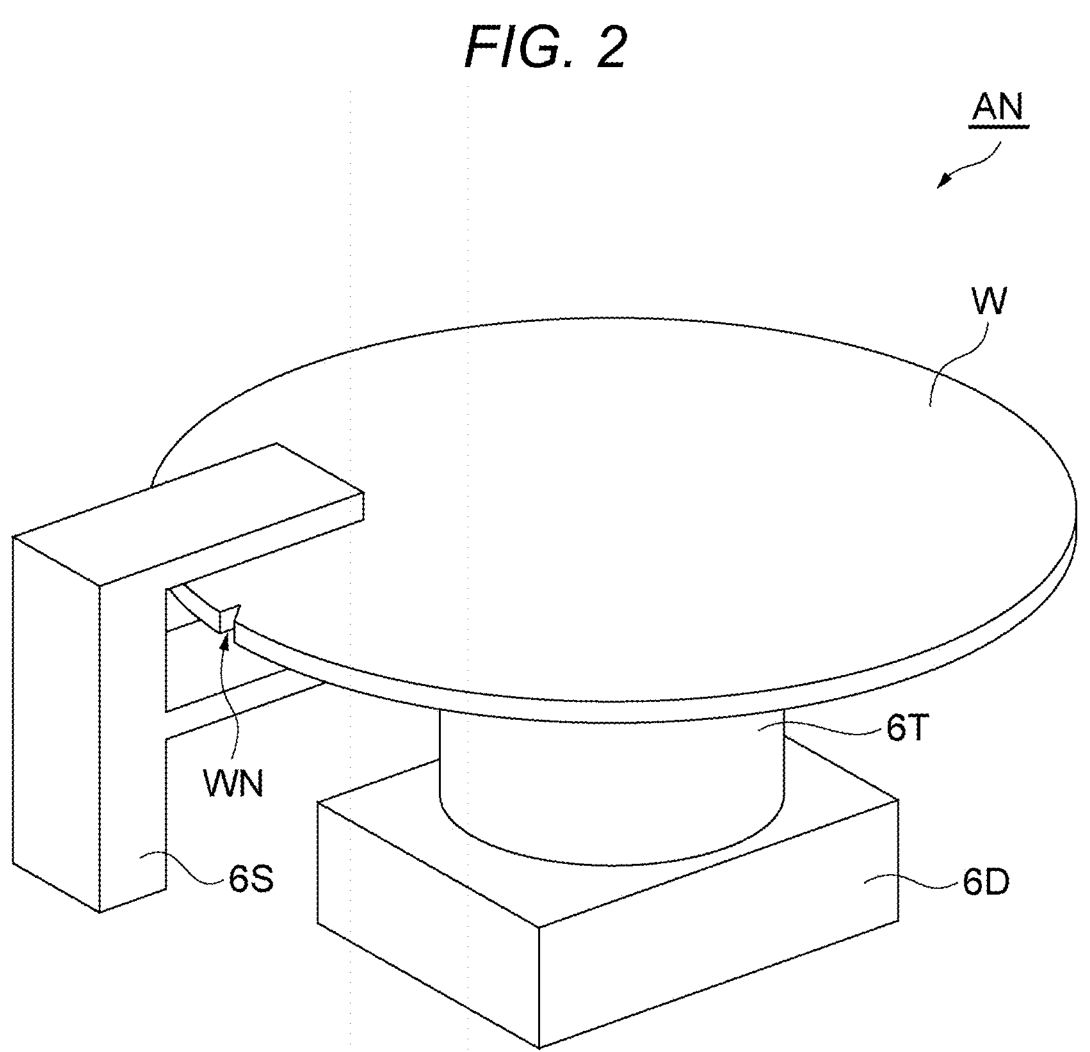
FIG. 2 is a perspective view illustrating an aligner.

The aligner AN is connected to the loader module LM. The aligner AN is configured to adjust a position (e.g., calibrate a position) of the workpiece W. FIG. 2 is a perspective view illustrating the aligner. The aligner AN includes a support stand 6T, a driving device 6D, and a sensor 6S. The support stand 6T is a stand that can rotate around an axis extending in a vertical direction, and is configured to support the workpiece W thereon. The support stand 6T is rotated by the driving device 6D. The driving device 6D is controlled by the controller MC. When the support stand 6T is rotated by the power from the driving device 6D, the workpiece W placed on the support stand 6T is also rotated.

The sensor 6S is an optical sensor and detects an edge of the workpiece W while the workpiece W is rotated. The sensor 6S detects a misalignment amount of the angular position of a notch WN (e.g., or another marker) of the workpiece W with respect to a reference angular position, and a misalignment amount of the central position of the workpiece W with respect to the reference position from the detection result of the edge. The sensor 6S outputs the misalignment amount of the angular position of the notch WN and the misalignment amount of the central position of the workpiece W to the controller MC. The controller MC calculates a rotation amount of the support stand 6T for correcting the angular position of the notch WN to the reference angular position based on the misalignment amount of the angular position of the notch WN. The controller MC controls the driving device 6D to rotate the support stand 6T only by the rotation amount. As a result, the angular position of the notch WN can be corrected to the reference angular position. In addition, the controller MC controls the position of an end effector of the transport device TU1 when receiving the workpiece W from the aligner AN based on the misalignment amount of the central position of the workpiece W. As a result, the central position of the workpiece W coincides with the predetermined position on the end effector of the transport device TU1.

Referring back to FIG. 1, each of the load-lock module LL1 and the load-lock module LL2 is provided between the loader module LM and the transfer module TF. Each of the load-lock modules LL1 and LL2 provides a preliminary decompression chamber.

The transfer module TF is connected to the load-lock module LL1 and the load-lock module LL2 in an airtight manner through a gate valve. The transfer module TF provides a decompression chamber capable of decompression. The decompression chamber is provided with a transport device TU2. The transport device TU2 is, for example, an articulated robot having a transport arm TUa and is controlled by the controller MC. The transport device TU2 is configured to transport the workpiece W between the load-lock modules LL1 to LL2 and the process modules PM1 to PM6, and between any two of the process modules PM1 to PM6.

The process modules PM1 to PM6 are connected to the transfer module TF in an airtight manner through gate valves. Each of the process modules PM1 to PM6 is a processing apparatus configured to perform dedicated processing such as plasma processing on the workpiece W.

A series of operations when the processing of the workpiece W is performed in the processing system 1 will be exemplified as follows. The transport device TU1 of the loader module LM takes out the workpiece W from any one of the containers 4*a* to 4*d*, and transports the workpiece W to the aligner AN. Next, the transport device TU1 takes out the workpiece W whose position is adjusted from the aligner AN, and transports the workpiece W to one load-lock module of the load-lock module LL1 and the load-lock module LL2. Next, one load-lock module decompresses the pressure in the preliminary decompression chamber to a predetermined pressure. Next, the transport device TU2 of the transfer module TF takes out the workpiece W from one load-lock module, and transports the workpiece W to any one of the process modules PM1 to PM6. One or more process modules of the process modules PM1 to PM6 process the workpiece W. The transport device TU2 transports the processed workpiece W from the process module to one load-lock module of the load-lock module LL1 and the load-lock module LL2. Next, the transport device TU1 transports the workpiece W from one load-lock module into any one of the containers 4*a* to 4*d*.

The processing system 1 is provided with the controller MC as described above. The controller MC may be a computer including a processor, a storage device such as a memory, a display device, an input and output device, a communication device, and the like. A series of operations of the processing system 1 described above is realized by the control of each part of the processing system 1 by the controller MC according to a program stored in the storage device.

Figure 3:
FIG. 3 is a view illustrating an example of a plasma processing apparatus.

FIG. 3 is a view illustrating an example of the plasma processing apparatus which may be adopted as any one of the process modules PM1 to PM6. A plasma processing apparatus 10 illustrated in FIG. 3 is a capacitively-coupled plasma etching apparatus. The plasma processing apparatus 10 is provided with a substantially cylindrical chamber main body 12. The chamber main body 12 is made of, for example, aluminum. An inner wall surface of the chamber main body 12 may be anodized. The chamber main body 12 is grounded for safety.

A substantially cylindrical support 14 is provided on a bottom portion of the chamber main body 12. The support 14 is made of, for example, an insulating material. The support 14 is provided in the chamber main body 12. The support 14 extends upward from a bottom of the chamber main body 12. In addition, a stage ST is provided in the chamber S provided by the chamber main body 12. The stage ST is supported by the support 14.

The stage ST has a lower electrode LE and an electrostatic chuck ESC. The lower electrode LE includes a first plate 18*a* and a second plate 18*b*. The first plate 18*a* and the second plate 18*b* are made of, for example, metal such as aluminum. The first plate 18*a* and the second plate 18*b* have a substantially disc shape. The second plate 18*b* is provided on the first plate 18*a*. The second plate 18*b* is electrically connected to the first plate 18*a*.

The electrostatic chuck ESC is provided on the second plate 18*b*. The electrostatic chuck ESC has a structure in which an electrode which is a conductive film is disposed between a pair of insulating layers or insulating sheets. The electrostatic chuck ESC has a substantially disc shape. A DC power source 22 is electrically connected to the electrode of the electrostatic chuck ESC through a switch 23. The electrostatic chuck ESC adsorbs the workpiece W by an electrostatic force such as a Coulomb force generated by a DC voltage from the DC power source 22. As a result, the electrostatic chuck ESC can hold the workpiece W.

An edge ring body ER1 is placed on a peripheral edge portion of the second plate 18*b*. The edge ring body ER1 is formed in, for example, an annular shape. When the edge ring body ER1 is placed on the second plate 18*b*, the edge ring body ER1 surrounds the electrostatic chuck ESC in a plan view. That is, the electrostatic chuck ESC is located in a region surrounded by the edge ring body ER1. When the workpiece W is transported onto the electrostatic chuck ESC, the edge ring body ER1 surrounds an edge of the workpiece W. That is, the workpiece W is located in the region surrounded by the edge ring body ER1. Similarly, when a measuring instrument 100 to be described later is transported onto the electrostatic chuck ESC, an edge ring ER to be described later surrounds an edge of the measuring instrument 100. That is, the measuring instrument 100 may be located in a region surrounded by the edge ring ER.

A coolant passage 24 is provided in the second plate 18*b*. The coolant passage 24 includes a temperature control device. A coolant is supplied from a chiller unit provided outside the chamber main body 12 to the coolant passage 24 through a pipe 26*a*. The coolant supplied to the coolant passage 24 is returned to the chiller unit through a pipe 26*b*. In this manner, the coolant is circulated between the coolant passage 24 and the chiller unit. By controlling the temperature of the coolant, the temperature of the workpiece W supported by the electrostatic chuck ESC is controlled.

A plurality (for example, three) of through-holes 25 penetrating the stage ST are formed in the stage ST. The through-holes 25 are formed inside the electrostatic chuck ESC in a plan view. A lift pin 25*a* is inserted into each of the through-holes 25. FIG. 3 illustrates one through-hole 25 into which one lift pin 25*a* is inserted. The lift pin 25*a* is vertically movable in the through-holes 25. As the lift pin 25*a* rises, the workpiece W supported on the electrostatic chuck ESC rises.

In the stage ST, a plurality (for example, three) of through-holes 27 penetrating the stage ST (lower electrode LE) are formed at positions outside the electrostatic chuck ESC in a plan view. A lift pin 27*a* is inserted into each of the through-holes 27. FIG. 3 illustrates one through-hole 27 into which one lift pin 27*a* is inserted. The lift pin 27*a* is vertically movable in the through-holes 27. When the lift pin 27*a* rises, the edge ring body ER1 supported on the second plate 18*b* rises.

In addition, the plasma processing apparatus 10 is provided with a gas supply line 28. The gas supply line 28 supplies a heat transfer gas from a heat transfer gas supply mechanism, for example, He gas, to a space between the upper surface of the electrostatic chuck ESC and the rear surface of the workpiece W.

In addition, the plasma processing apparatus 10 is provided with an upper electrode 30. The upper electrode 30 is disposed above the stage ST so as to face the stage ST. The upper electrode 30 is supported on an upper portion of the chamber main body 12 via an insulating shielding member 32. The upper electrode 30 may include a top plate 34 and a support 36. The top plate 34 faces the chamber S. Gas discharge holes 34*a* are provided in the top plate 34. The top plate 34 may be formed of silicon or quartz. Alternatively, the top plate 34 may be configured by forming a plasma-resistant film such as yttrium oxide on the surface of an aluminum base material.

The support 36 is a component that detachably supports the top plate 34. The support 36 may be formed of, for example, a conductive material such as aluminum. The support 36 may have a water-cooled structure. A gas diffusion chamber 36*a* is provided in the interior of the support 36. A plurality of gas flow holes 36*b* communicating with the gas discharge holes 34*a* extend downward from the gas diffusion chamber 36*a*. Further, a gas introduction port 36*c* for introducing a processing gas into the gas diffusion chamber 36*a* is formed in the support 36. A gas supply pipe 38 is connected to the gas introduction port 36*c*.

A gas source group 40 is connected to the gas supply pipe 38 through a valve group 42 and a flow rate controller group 44. The gas source group 40 includes a plurality of gas sources for a plurality of types of gases. In an example, the gas source group 40 may include respective sources of a fluorocarbon gas, a hydrofluorocarbon gas, a hydrocarbon gas, a rare gas, an oxygen-containing gas, a nitrogen gas, a hydrogen gas, and a silicon-containing gas. The source of the fluorocarbon gas may include, for example, a source of $C_4F_8$ gas, a source of $CF_4$ gas, a source of $C_4F_6$ gas, and a source of $C_5F_8$ gas. The source of the hydrofluorocarbon gas may include, for example, a source of $CHF_3$ gas, a source of $CH_2F_2$ gas, and a source of $CH_3F$ gas. In an example, the source of the hydrocarbon gas may include a source of $CH_4$ gas, $C_2H_2$ gas, $C_2H_4$ gas, $C_2H_6$ gas, $C_3H_4$ gas, $C_3H_6$ gas, $C_3H_8$ gas, $C_4H_4$ gas, $C_4H_6$ gas, $C_4H_8$ gas, or $C_4H_{10}$ gas. The source of the rare gas may be a source of any rare gas such as He gas, Ne gas, Ar gas, Kr gas, or Xe gas. In an example, the source of the rare gas is the source of the Ar gas. In an example, the source of the oxygen-containing gas includes a source of an oxygen gas ($O_2$ gas). The source of the oxygen-containing gas may further include a source of a CO gas and/or a source of a $CO_2$ gas. In an example, the source of the silicon-containing gas may include an aminosilane gas, a silicon alkoxide-based gas, or silicon halide.

The valve group 42 includes a plurality of valves. The flow rate controller group 44 includes a plurality of flow rate controllers such as mass flow controllers. The plurality of gas sources of the gas source group 40 are connected to the gas supply pipe 38 through the corresponding valves of the valve group 42 and the corresponding flow rate controllers of the flow rate controller group 44, respectively.

In addition, in the plasma processing apparatus 10, a deposition shield 46 is detachably provided along the inner wall of the chamber main body 12. The deposition shield 46 is also provided on the outer periphery of the support 14. The deposition shield 46 is a component that prevents etching by-products (e.g., deposits) from adhering to the chamber main body 12. The deposition shield 46 may be configured by coating an aluminum material with ceramics such as yttrium oxide.

An exhaust plate 48 is provided on the bottom portion side of the chamber main body 12 and between the support 14 and the side wall of the chamber main body 12. The exhaust plate 48 may be configured, for example, by coating an aluminum material with ceramic such as yttrium oxide. The exhaust plate 48 is formed with a plurality of holes penetrating in the plate thickness direction. An exhaust port 12*e* is provided below the exhaust plate 48 and in the chamber main body 12. An exhaust device 50 is connected to the exhaust port 12*e* via an exhaust pipe 52. The exhaust device 50 includes a pressure adjusting valve, and a vacuum pump such as a turbo molecular pump. The exhaust device 50 can reduce the pressure in the space inside the chamber main body 12 to a desired vacuum level. A loading outlet 12*g* for the workpiece W is provided in the side wall of the chamber main body 12. The loading outlet 12*g* can be opened and closed by a gate valve 54.

In addition, the plasma processing apparatus 10 is further provided with a first radio-frequency power supply 62 and a second radio-frequency power supply 64. The first radio-frequency power supply 62 is a power supply that generates a first radio-frequency for plasma generation. The first radio-frequency power supply 62 generates a radio-frequency having a frequency of, for example, 27 MHz to 100 MHz. The first radio-frequency power supply 62 is connected to the upper electrode 30 via a matcher 66. The matcher 66 includes a circuit for matching the output impedance of the first radio-frequency power supply 62 with the input impedance on a load side (upper electrode 30 side). The first radio-frequency power supply 62 may be connected to the lower electrode LE via the matcher 66.

The second radio-frequency power supply 64 is a power supply that generates a second radio-frequency for drawing ions to the workpiece W. The second radio-frequency power supply 64 generates a radio-frequency having a frequency in a range of, for example, 400 kHz to 13.56 MHz. The second radio-frequency power supply 64 is connected to the lower electrode LE through a matcher 68. The matcher 68 includes a circuit for matching the output impedance of the second radio-frequency power supply 64 with the input impedance of the load side (lower electrode LE side).

In the plasma processing apparatus 10, a gas from one or more gas sources selected from the plurality of gas sources is supplied into the chamber S. In addition, the pressure in the chamber S is set to a predetermined pressure by the exhaust device 50. Furthermore, the gas in the chamber S is excited by the first radio-frequency from the first radio-frequency power supply 62. As a result, plasma is generated. The workpiece W is processed by the generated active species. If necessary, the ions may be attracted into the workpiece W by the bias based on the second radio-frequency of the second radio-frequency power supply 64.

Figure 4:
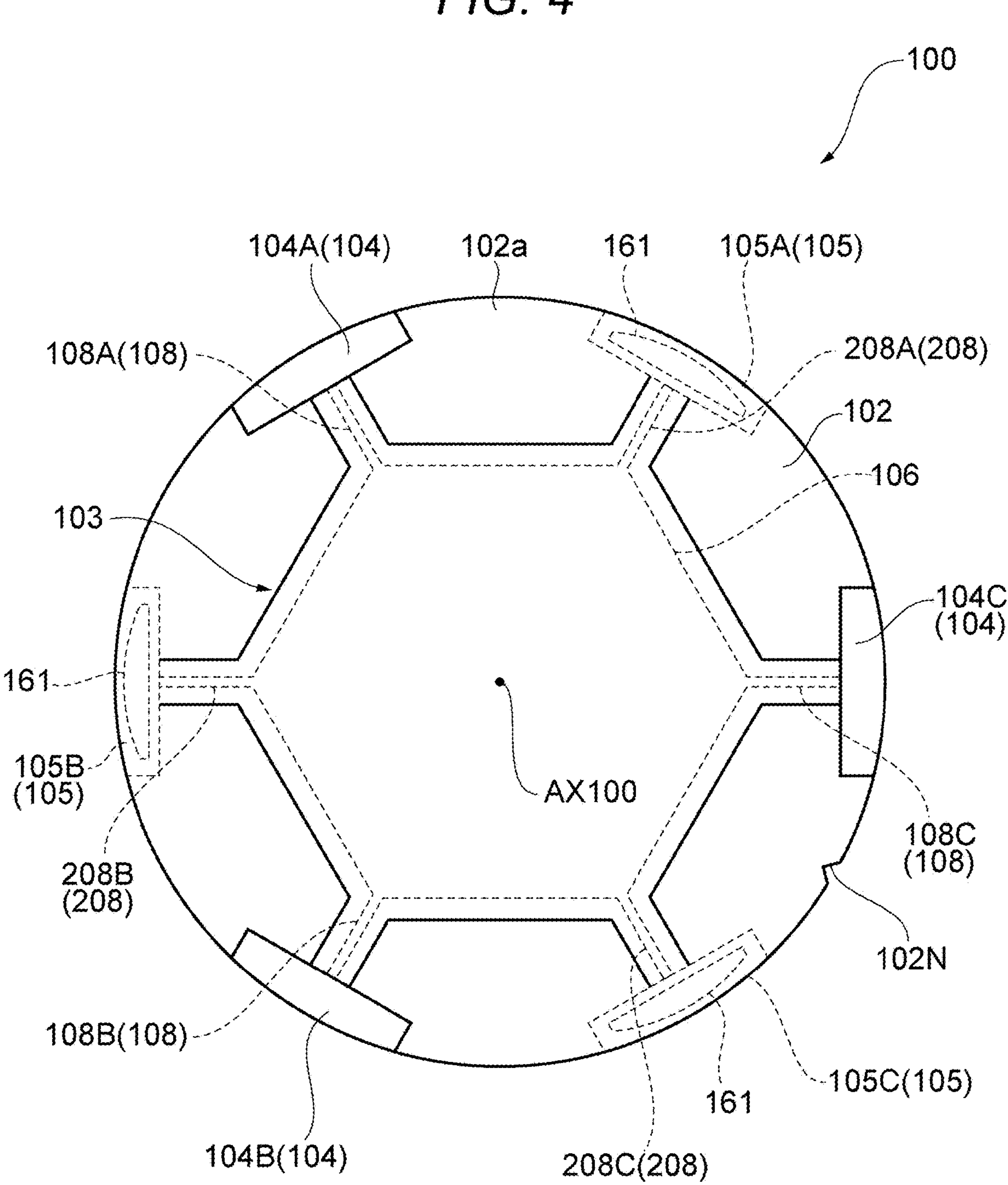
FIG. 4 is a plan view illustrating an exemplary measuring instrument as viewed from an upper surface side.
Figure 5:
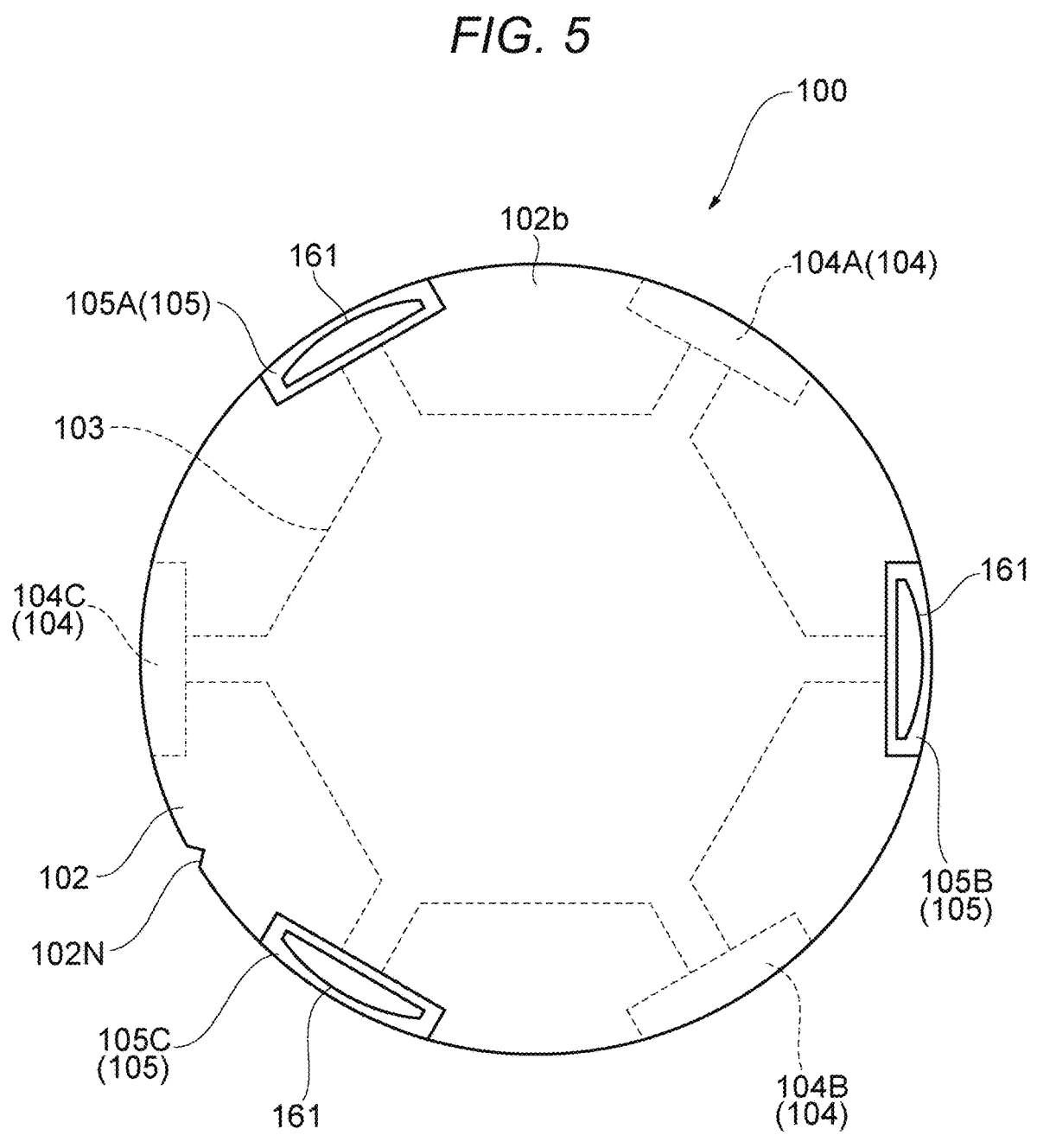

Next, the measuring instrument 100 will be described. FIG. 4 is a plan view illustrating the measuring instrument as viewed from an upper surface side. FIG. 5 is a plan view illustrating the measuring instrument as viewed from a lower surface side. The measuring instrument 100 illustrated in FIGS. 4 and 5 includes a base substrate 102 having an upper surface 102*a* and a lower surface 102*b*. The base substrate 102 is formed of, for example, silicon. The base substrate 102 has a shape similar to the shape of the workpiece W, that is, a substantially disc shape. A diameter of the base substrate 102 is the same as a diameter of the workpiece W, and is, for example, 300 mm. The shape and dimensions of the measuring instrument 100 are defined by the shape and dimensions of the base substrate 102. Therefore, the measuring instrument 100 has a shape similar to the shape of the workpiece W and has dimensions similar to the dimensions of the workpiece W. Further, a notch 102N (e.g., or another marker) is formed at an edge of the base substrate 102.

The base substrate 102 includes first sensors 104A to 104C for measuring capacitances. The first sensors 104A to 104C are arranged at equal intervals in a circumferential direction along the edge of the base substrate 102, for example, over the entire circumference of the edge. Specifically, the first sensors 104A to 104C are provided along the edge on the upper surface of the base substrate 102. Front end surfaces of the first sensors 104A to 104C extend along a side surface of the base substrate 102.

Further, the base substrate 102 is provided with second sensors 105A to 105C for measuring capacitances. The second sensors 105A to 105C are arranged at equal intervals in the circumferential direction along the edge of the base substrate 102, for example, over the entire circumference of the edge. Specifically, the second sensors 105A to 105C are provided along the edge on the lower surface of the base substrate. Sensor electrodes 161 of the respective second sensors 105A to 105C extend along an extending direction of the lower surface 102*b* of the base substrate 102. Further, the second sensors 105A to 105C and the first sensors 104A to 104C are alternately arranged at intervals of 60 degrees in the circumferential direction. In the following description, the first sensors 104A to 104C and the second sensors 105A to 105C may be collectively referred to as capacitance sensors.

A circuit substrate 106 is provided at a center of the upper surface 102*a* of the base substrate 102. Wiring groups 108A to 108C for electrically connecting the circuit substrate 106 with the first sensors 104A to 104C are provided between the circuit substrate 106 and the first sensors 104A to 104C. Further, wiring groups 208A to 208C for electrically connecting the circuit substrate 106 with the second sensors 105A to 105C are provided between the circuit substrate 106 and the second sensors 105A to 105C. The circuit substrate 106, the wiring groups 108A to 108C, and the wiring groups 208A to 208C are covered with a cover 103.

Figure 6:
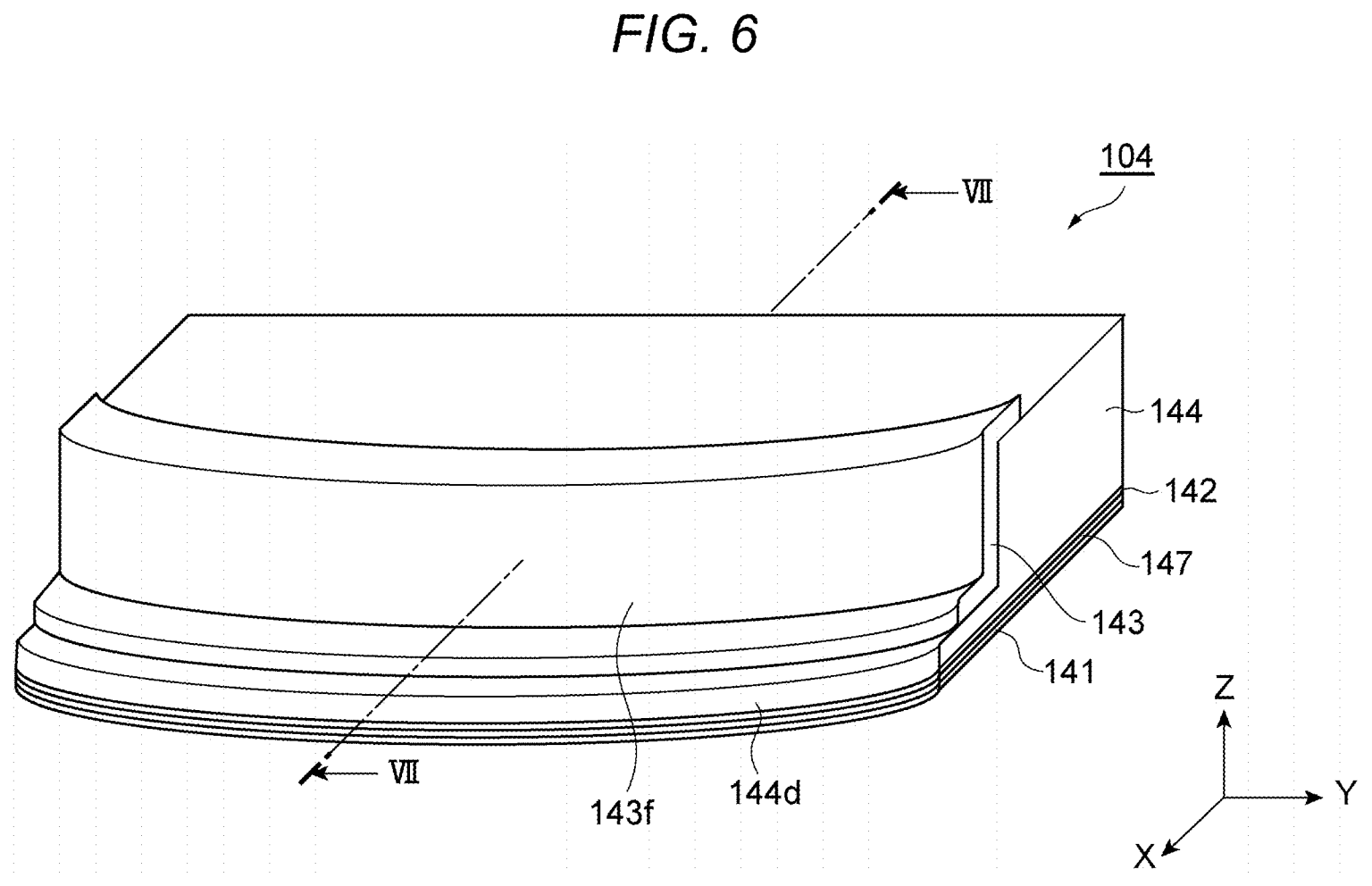
Figure 7:
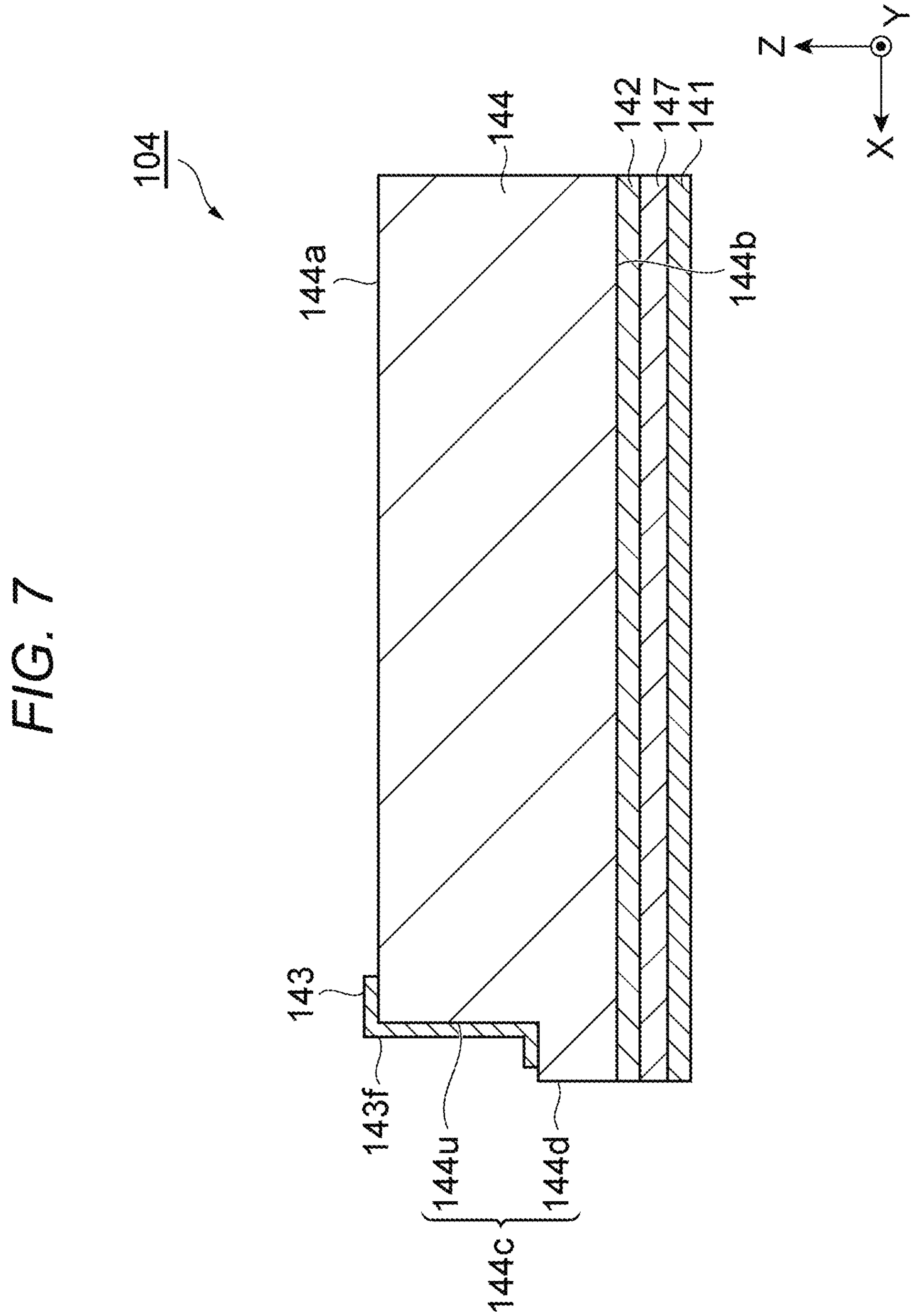
FIG. 7 is a cross-sectional view of the first sensor in the measuring instrument.

Hereinafter, the first sensor will be described in detail. FIG. 6 is a perspective view illustrating an example of the sensor. FIG. 7 is a cross-sectional view taken along a line VII-VII in FIG. 6. The first sensor 104 shown in FIGS. 6 and 7 is a sensor used as the first sensors 104A to 104C of the measuring instrument 100. In an example, the first sensor 104 is implemented as a chip-shaped component. In the following description, an XYZ orthogonal coordinate system will be referred to as appropriate. An X direction indicates a front direction of the first sensor 104. A Y direction is a direction orthogonal to the X direction and indicates a width direction of the first sensor 104. AZ direction is a direction orthogonal to the X direction and the Y direction and indicates an upper direction of the first sensor 104.

The first sensor 104 includes an electrode 141, a guard electrode 142, a sensor electrode 143, a substrate portion 144, and an insulating region 147.

The substrate portion 144 is formed of, for example, borosilicate glass or quartz. The substrate portion 144 has an upper surface 144*a*, a lower surface 144*b*, and a front end surface 144*c*. The guard electrode 142 is provided below the lower surface 144*b* of the substrate portion 144. The guard electrode 142 extends in the X direction and the Y direction. Further, the electrode 141 is provided below the guard electrode 142 with the insulating region 147 interposed therebetween. The electrode 141 extends in the X direction and the Y direction. The insulating region 147 is formed of, for example, $SiO_2$, SiN, $Al_2O_3$, or polyimides.

The front end surface 144*c* of the substrate portion 144 is formed in a stepped shape. A lower portion 144*d* of the front end surface 144*c* protrudes outward in a horizontal direction from an upper portion 144*u* of the front end surface 144*c*. The sensor electrode 143 extends along the upper portion 144*u* of the front end surface 144*c*. In one exemplary embodiment, the upper portion 144*u* and the lower portion 144*d* of the front end surface 144*c* are each curved having a predetermined curvature. That is, the upper portion 144*u* of the front end surface 144*c* has a fixed curvature at any position of the upper portion 144*u*. The curvature of the upper portion 144*u* is a reciprocal of the distance between a central axis AX100 of the measuring instrument 100 and the upper portion 144*u* of the front end surface 144*c*. Further, the lower portion 144*d* of the front end surface 144*c* has a fixed curvature at any position of the lower portion 144*d*. The curvature of the lower portion 144*d* is a reciprocal of the distance between the central axis AX100 of the measuring instrument 100 and the lower portion 144*d* of the front end surface 144*c*.

The sensor electrode 143 is provided along the upper portion 144*u* of the front end surface 144*c*. In one exemplary embodiment, a front surface 143*f* of the sensor electrode 143 is also curved. That is, the front surface 143*f* of the sensor electrode 143 has a fixed curvature at any position of the front surface 143*f*. The curvature is a reciprocal of the distance between the central axis AX100 of the measuring instrument 100 and the front surface 143*f*.

In a case of using the first sensor 104 as the sensor of the measuring instrument 100, the electrode 141 is connected to the wiring 181, the guard electrode 142 is connected to the wiring 182, and the sensor electrode 143 is connected to the wiring 183 as described later.

In the first sensor 104, the sensor electrode 143 is shielded from below the first sensor 104 by the electrode 141 and the guard electrode 142. Therefore, according to the first sensor 104, it is possible to measure the capacitance with high directivity in a specific direction, that is, in a direction (e.g., X direction) in which the front surface 143*f* of the sensor electrode 143 faces.

Figure 8:
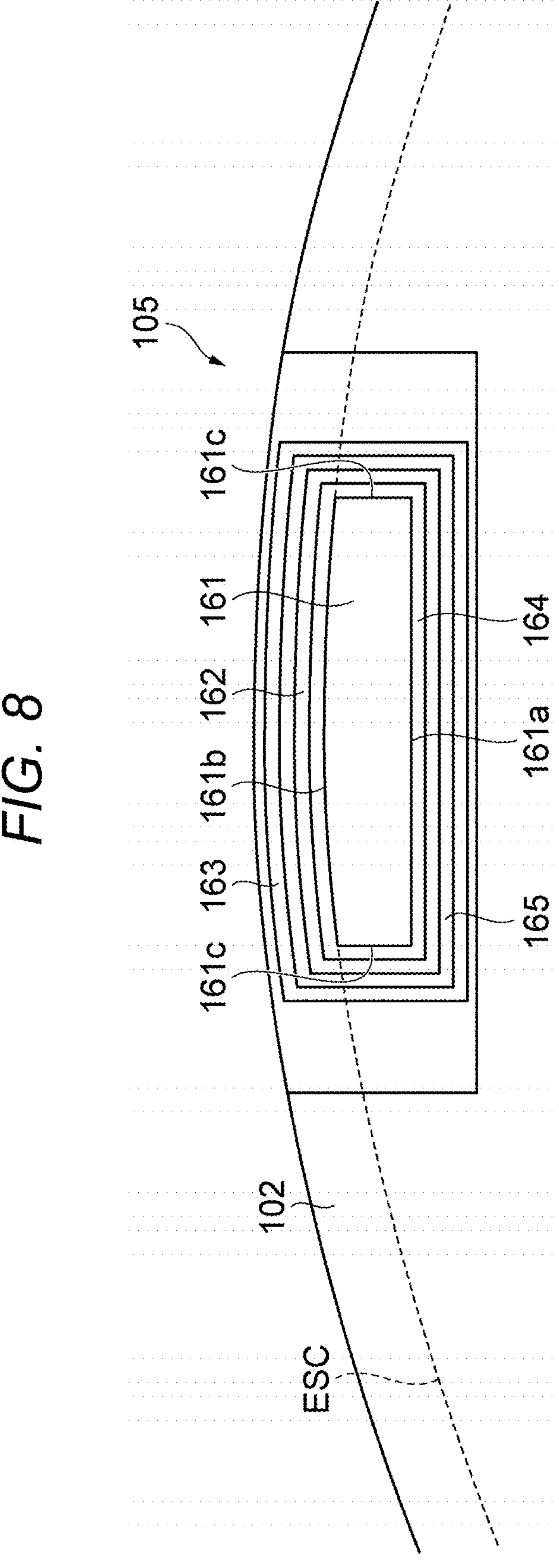
FIG. 8 is an enlarged view illustrating an example of a second sensor in the measuring instrument.

Hereinafter, the second sensor will be described. FIG. 8 is a partially enlarged view of FIG. 5, and illustrates one second sensor. The second sensor 105 includes a sensor electrode 161. A part of an edge of the sensor electrode 161 has a circular arc shape. For example, the sensor electrode 161 has a planar shape defined by an inner edge 161*a*, an outer edge 161*b*, and a side edge 161*c*. As an example, the outer edge 161*b* has a circular arc shape having a radius centered on the central axis AX100. The side edge 161*c* and the inner edge 161*a* can be straight (e.g., planar). The outer edges 161*b* on the outer side in the radial direction of the respective sensor electrodes 161 of the second sensors 105A to 105C extend on a common circle. A curvature of a part of the edge of the sensor electrode 161 coincides with a curvature of an edge of the electrostatic chuck ESC. In one exemplary embodiment, the curvature of the outer edge 161*b* forming the edge on the outer side in the radial direction of the sensor electrode 161 coincides with the curvature of the edge of the electrostatic chuck ESC. A center of curvature of the outer edge 161*b*, that is, a center of the circle on which the outer edge 161*b* extends, shares the central axis AX 100.

In one exemplary embodiment, the second sensor 105 further includes a guard electrode 162 that surrounds the sensor electrode 161. The guard electrode 162 has a frame shape and surrounds the entire periphery of the sensor electrode 161. The guard electrode 162 and the sensor electrode 161 are spaced apart from each other such that an electrically insulating region 164 is interposed therebetween. In one exemplary embodiment, the second sensor 105 further includes an electrode 163 that surrounds the guard electrode 162 at an outer side of the guard electrode 162. The electrode 163 has a frame shape and surrounds the entire periphery of the guard electrode 162. The guard electrode 162 and the electrode 163 are spaced apart from each other such that an electrically insulating region 165 is interposed therebetween.

Figure 9:
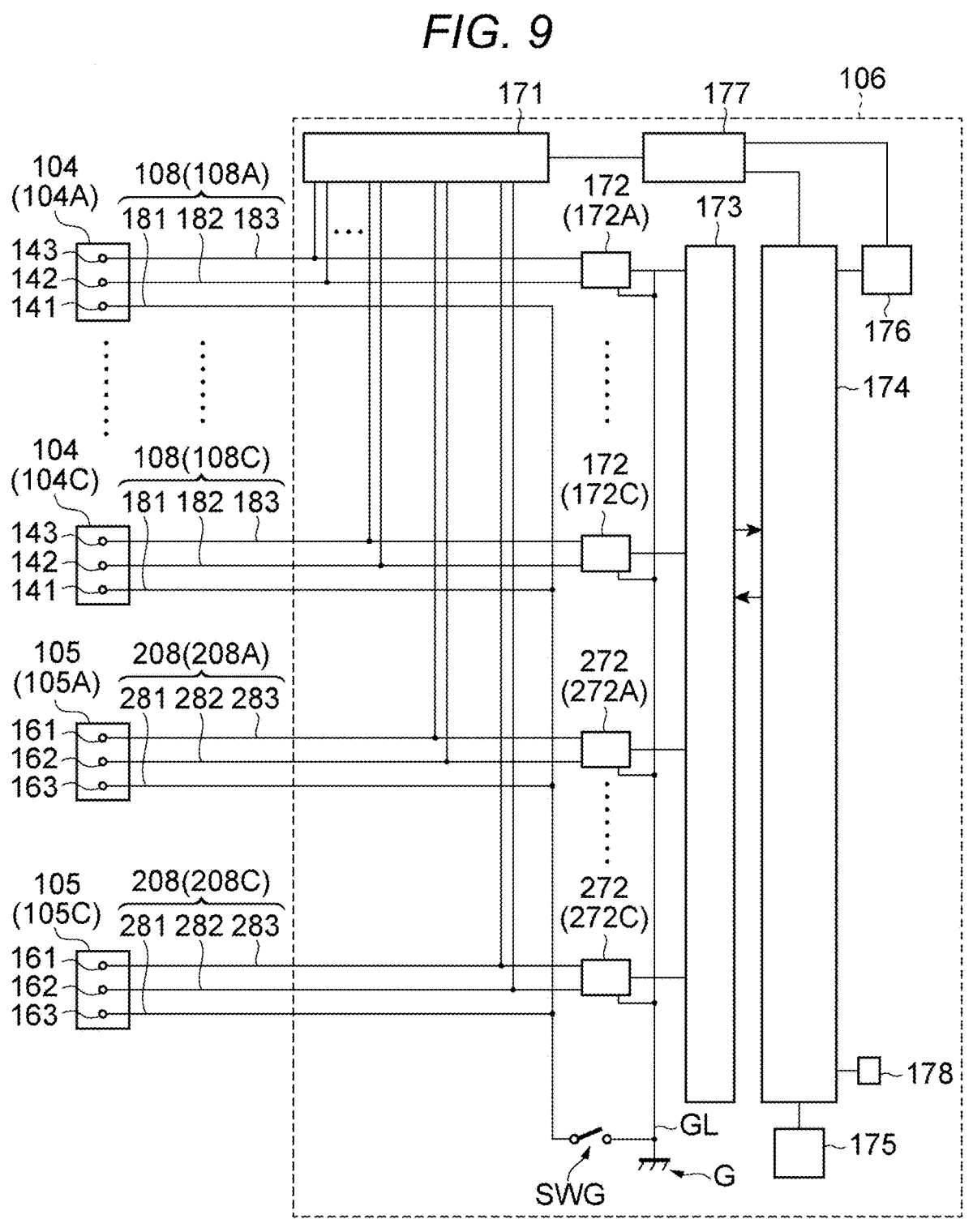

Hereinafter, a configuration of the circuit substrate 106 will be described. FIG. 9 is a view illustrating a configuration of a circuit substrate of the measuring instrument. The circuit substrate 106 includes a radio frequency oscillator 171, C/V conversion circuits 172A to 172C, C/V conversion circuits 272A to 272C, an A/D converter 173, a processor 174, a storage device 175, a communication device 176, and a power supply 177. In an example, the processor 174, the storage device 175, and the like constitute an arithmetic unit.

Each of the first sensors 104A to 104C is connected to the circuit substrate 106 through a corresponding wiring group among the wiring groups 108A to 108C. Further, each of the first sensors 104A to 104C is connected to the corresponding C/V conversion circuit among the C/V conversion circuits 172A to 172C through several wirings included in the corresponding wiring group. Each of the second sensors 105A to 105C is connected to the circuit substrate 106 through a corresponding wiring group among the wiring groups 208A to 208C. Further, each of the second sensors 105A to 105C is connected to the corresponding C/V conversion circuit among the C/V conversion circuits 272A to 272C through several wirings included in the corresponding wiring group. Hereinafter, one first sensor 104 having the same configuration as each of the first sensors 104A to 104C, one wiring group 108 having the same configuration as each of the wiring groups 108A to 108C, and one C/V conversion circuit 172 having the same configuration as each of the C/V conversion circuits 172A to 172C will be described. Further, one second sensor 105 having the same configuration as each of the second sensors 105A to 105C, one wiring group 208 having the same configuration as each of the wiring groups 208A to 208C, and one C/V conversion circuit 272 having the same configuration as each of the C/V conversion circuits 272A to 272C will be described.

The wiring group 108 includes wirings 181 to 183. One end of the wiring 181 is connected to the electrode 141. The wiring 181 is connected to a ground potential line GL connected to the ground G of the circuit substrate 106. The wiring 181 may be connected to the ground potential line GL through a switch SWG. Further, one end of the wiring 182 is connected to the guard electrode 142. The other end of the wiring 182 is connected to the C/V conversion circuit 172. Further, one end of the wiring 183 is connected to the sensor electrode 143. The other end of the wiring 183 is connected to the C/V conversion circuit 172.

The wiring group 208 includes wirings 281 to 283. One end of the wiring 281 is connected to the electrode 163. The wiring 281 is connected to the ground potential line GL connected to the ground G of the circuit substrate 106. The wiring 281 may be connected to the ground potential line GL through the switch SWG. Further, one end of the wiring 282 is connected to the guard electrode 162. The other end of the wiring 282 is connected to the C/V conversion circuit 272. Further, one end of the wiring 283 is connected to the sensor electrode 161. The other end of the wiring 283 is connected to the C/V conversion circuit 272.

The radio frequency oscillator 171 is connected to the power supply 177 such as a battery. The radio frequency oscillator 171 receives power from the power supply 177 and generates a radio frequency signal. The power supply 177 is also connected to the processor 174, the storage device 175, and the communication device 176. The radio frequency oscillator 171 has a plurality of output lines. The radio frequency oscillator 171 supplies the generated radio frequency signal to the wirings 182 and 183, and to the wirings 282 and 283 through output lines. Accordingly, the radio frequency oscillator 171 is electrically connected to the guard electrode 142 and the sensor electrode 143 of the first sensor 104. The radio frequency signal from the radio frequency oscillator 171 is supplied to the guard electrode 142 and the sensor electrode 143. Further, the radio frequency oscillator 171 is electrically connected to the sensor electrode 161 and the guard electrode 162 of the second sensor 105. The radio frequency signal from the radio frequency oscillator 171 is supplied to the sensor electrode 161 and the guard electrode 162.

The wiring 182 connected to the guard electrode 142 and the wiring 183 connected to the sensor electrode 143 are connected to the input of the C/V conversion circuit 172. That is, the guard electrode 142 and the sensor electrode 143 of the first sensor 104 are connected to the input of the C/V conversion circuit 172. Further, the sensor electrode 161 and the guard electrode 162 are connected to the input of the C/V conversion circuit 272. The C/V conversion circuit 172 and the C/V conversion circuit 272 are configured to generate a voltage signal having an amplitude according to a potential difference at their inputs, and output the voltage signal. The C/V conversion circuit 172 generates a voltage signal according to the capacitance formed by the corresponding first sensor 104. That is, as the capacitance of the sensor electrode connected to the C/V conversion circuit 172 increases, the magnitude in voltage of the voltage signal that is output from the C/V conversion circuit 172 increases. Similarly, as the capacitance of the sensor electrode connected to the C/V conversion circuit 272 increases, the magnitude in voltage of the voltage signal that is output from the C/V conversion circuit 272 increases.

The outputs of the C/V conversion circuit 172 and the C/V conversion circuit 272 are connected to the input of the A/D converter 173. Further, the A/D converter 173 is connected to the processor 174. The A/D converter 173 is controlled according to a control signal from the processor 174, converts an output signal (voltage signal) from the C/V conversion circuit 172 and an output signal (voltage signal) from the C/V conversion circuit 272 into digital values, and outputs the digital values to the processor 174 as detection values.

The storage device 175 is connected to the processor 174. The storage device 175 is a storage device such as a volatile memory, and stores measured data, for example. Further, another storage device 178 is connected to the processor 174. The storage device 178 may be a storage device such as a nonvolatile memory. For example, the storage device 178 stores a program to be read and executed by the processor 174.

The communication device 176 is a communication device based on any radio communication standard. For example, the communication device 176 is based on Bluetooth (registered trademark). The communication device 176 is configured to wirelessly transmit measured data stored in the storage device 175.

The processor 174 is configured to control each part of the measuring instrument 100 by executing the program described above. For example, the processor 174 controls the supply of the radio frequency signal from the radio frequency oscillator 171 to the guard electrode 142, the sensor electrode 143, the sensor electrode 161, and the guard electrode 162. Further, the processor 174 controls the supply of power from the power supply 177 to the storage device 175, the supply of power from the power supply 177 to the communication device 176, and the like. Further, the processor 174 executes the program described above to acquire measured values of the first sensor 104 and measured values of the second sensor 105 based on a detection value input from the A/D converter 173. In one embodiment, when the detection value output from the A/D converter 173 is set as X, the processor 174 acquires the measured value based on the detection value such that the measured value is proportional to (a·X+b). Here, a and b are constants that vary depending on a circuit state or the like. The processor 174 may have, for example, a predetermined arithmetic expression (function) such that the measured value is proportional to (a·X+b).

Figure 10:
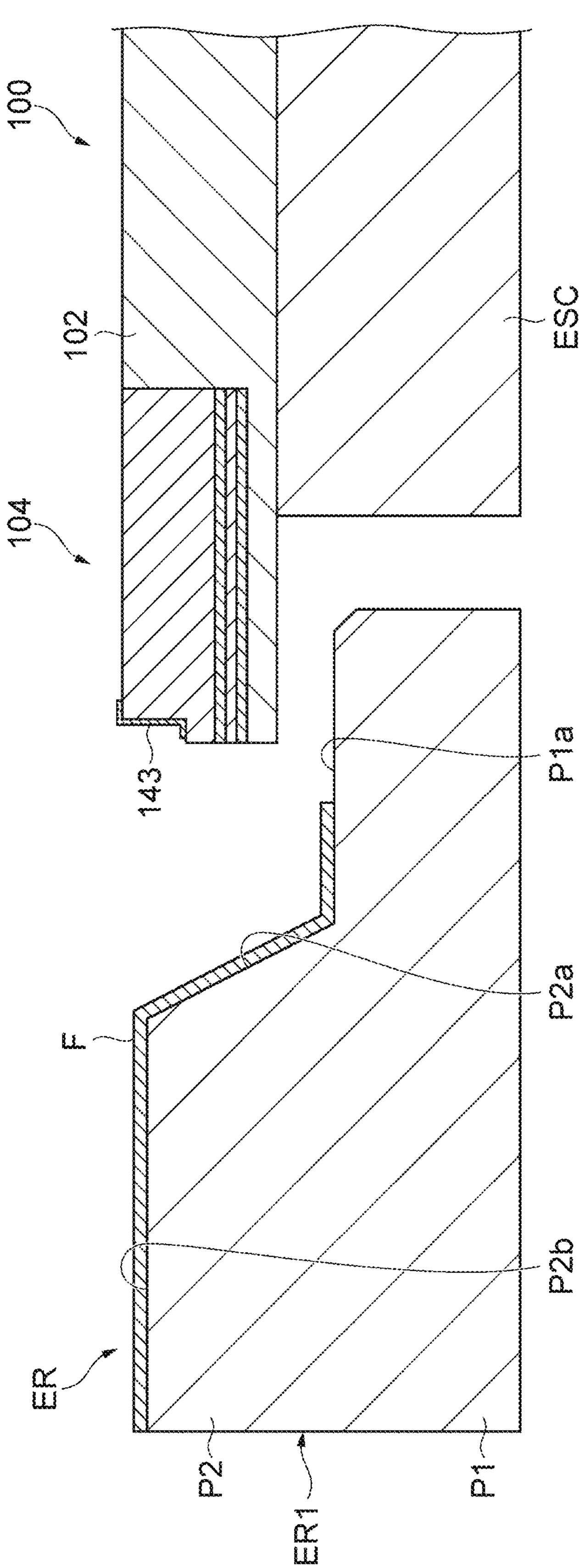
FIG. 10 is a cross-sectional view taken along a radial direction, illustrating an exemplary edge ring.

FIG. 10 is a cross-sectional view illustrating the measuring instrument 100 placed on the electrostatic chuck ESC and the edge ring ER. In an exemplary measurement method and measurement system, the capacitance between the edge ring ER placed on the second plate 18*b* and the measuring instrument 100 placed on the electrostatic chuck ESC is measured. As illustrated in FIG. 10, the edge ring ER includes the edge ring body ER1 and a conductive film F. The edge ring body ER1 includes a first part P1 and a second part P2. The first part P1 and the second part P2 are integrally formed. The second part P2 is a part on an upper side of the first part P1. The first part P1 and the second part P2 have an annular plate shape. The first part P1 and the second part P2 have a common central axis. An outer diameter of the second part P2 and an outer diameter of the first part P1 may be the same. An inner diameter of the first part P1 is smaller than an inner diameter of the second part P2.

Further, the inner diameter of the first part P1 is smaller than an outer diameter of the measuring instrument 100, and the inner diameter of the second part P2 is larger than the outer diameter of the measuring instrument 100. The inner diameter of the second part P2 is an inner diameter of an inner peripheral surface P2*a* of the second part P2. In an example, the inner peripheral surface P2*a* of the second part P2 is an inclined surface that widens outward toward the upper side. In this case, the outer diameter of the measuring instrument 100 may be smaller than the inner diameter of a lower end of the inner peripheral surface P2*a*. The inner peripheral surface P2*a* is not necessarily inclined, and may be, for example, a cylindrical vertical surface.

The workpiece W may be placed on the electrostatic chuck ESC such that the edge thereof is located above the first part P1 in an inner region of the second part P2. Similarly, the measuring instrument 100 may be placed on the electrostatic chuck ESC such that the edge thereof is located above the first part P1 in the inner region of the second part P2. In a state where the measuring instrument 100 is placed on the electrostatic chuck ESC, the sensor electrode 143 of the first sensor 104 of the measuring instrument 100 may face the inner peripheral surface P2*a* of the edge ring body ER1.

The edge ring body ER1 may be formed of an insulator. Further, the edge ring body ER1 may be formed of a material other than the insulator, and may be formed of, for example, a semiconductor. Examples of the material of the edge ring body ER1 include monocrystalline silicon, quartz, and silicon carbide.

The conductive film F is a film having conductivity different from the edge ring body ER1 in composition. The conductive film F is formed on at least a part of the surface of the edge ring body ER1. The conductive film F has an electric conduction rate higher than the electric conduction rate of the edge ring body ER1. For example, the conductive film F may be a carbon-based film containing carbon atoms, and an example of the conductive film F may be a graphite thin film. The electric conduction rate of the conductive film F may be, for example, about 0.25 S/cm or higher. The conductive film F is formed at least on a portion of the edge ring body ER1 facing the sensor electrodes 143 of the measuring instrument 100. In the illustrated example, of the surface of the edge ring body ER1, the conductive film F is formed on the entire upper surface P2*b* and the entire inner peripheral surface P2*a* of the second part P2. Further, in the illustrated example, the conductive film F is also formed in a region, of an upper surface P1*a* of the first part P1 of the edge ring body ER1, close to the inner peripheral surface P2*a*. For example, a thickness of the conductive film F formed on the entire upper surface P2*b* and the entire inner peripheral surface P2*a* may be substantially uniform. The film thickness of the conductive film F is not particularly limited. The method of forming the conductive film F is not particularly limited, and for example, the conductive film F may be formed by chemical vapor deposition (CVD). The CVD may be plasma chemical vapor deposition (plasma CVD), or may be a CVD method using heat, light, or the like.

The measuring instrument 100 may be disposed in the region surrounded by the edge ring ER in the process module. In this state, the sensor electrodes 143 and the guard electrodes 142 face the conductive film F formed on the inner peripheral surface P2*a* of the edge ring ER. A measured value generated based on the potential difference between the signal from the sensor electrode 143 and the signal from the guard electrode 142 indicates the capacitance that reflects the distance between each of the sensor electrodes 143 and the edge ring ER. The capacitance C is expressed by $C=\varepsilon S/d$. Here, ε is a dielectric constant of the medium between the front surface 143*f* of the sensor electrode 143 and the edge ring ER. Further, S is the area of the front surface 143*f* of the sensor electrode 143. Further, d may be regarded as a distance between the front surface 143*f* of the sensor electrode 143 and an inner edge of the edge ring ER. The inner edge of the edge ring ER may be the conductive film F formed on the inner peripheral surface P2*a*.

Therefore, according to the measuring instrument 100, measured data reflecting a relative positional relationship between the measuring instrument 100 mimicking the workpiece W and the edge ring ER is obtained. For example, as the distance between the front surface 143*f* of the sensor electrode 143 and the inner edge of the edge ring ER is larger, the measured values acquired by the measuring instrument 100 are smaller. Therefore, a misalignment amount of each sensor electrode 143 in each radial direction of the edge ring ER can be obtained based on the measured value indicating the capacitance of the sensor electrode 143 of each of the first sensors 104A to 104C. An error in the transport position of the measuring instrument 100 can be obtained based on the misalignment amount of the sensor electrode 143 of each of the first sensors 104A to 104C in each radial direction. That is, the misalignment amount between the central position of the edge ring ER and the central position of the measuring instrument 100 can be obtained.

Further, in a state where the measuring instrument 100 is placed on the electrostatic chuck ESC, the sensor electrodes 161 and the guard electrodes 162 of the second sensor 105 face the electrostatic chuck ESC. As described above, the capacitance C is expressed by $C=\varepsilon S/d$. Here, ε is the dielectric constant of the medium between the sensor electrode 161 and the electrostatic chuck ESC. Further, d is the distance between the sensor electrode 161 and the electrostatic chuck ESC. Further, S can be regarded as the area where the sensor electrode 161 and the electrostatic chuck ESC overlap each other in a plan view. The area S varies according to a relative positional relationship between the measuring instrument 100 and the electrostatic chuck ESC. Therefore, according to the measuring instrument 100, measured data reflecting the relative positional relationship between the measuring instrument 100 mimicking the workpiece W and the electrostatic chuck ESC is obtained.

In an example, when the measuring instrument 100 is transported to a predetermined transport position, that is, a position on the electrostatic chuck ESC where the center of the electrostatic chuck ESC and the center of the measuring instrument 100 coincide with each other, the outer edge 161*b* of the sensor electrode 161 and the edge of the electrostatic chuck ESC may coincide with each other. In this case, for example, when the transport position of the measuring instrument 100 is misaligned from the predetermined transport position, the area S becomes small when the sensor electrode 161 is misaligned outward in the radial direction with respect to the electrostatic chuck ESC. That is, the capacitance measured by the sensor electrode 161 is smaller than the capacitance measured when the measuring instrument 100 is transported to the predetermined transport position. Therefore, the misalignment amount of each sensor electrode 161 in each radial direction of the electrostatic chuck ESC can be obtained based on the measured values indicating the capacitance of the sensor electrodes 161 of each of the second sensors 105A to 105C. The error in the transport position of the measuring instrument 100 can be obtained based on the misalignment amount of the sensor electrode 161 of each of the second sensors 105A to 105C in each radial direction. That is, the misalignment amount between the central position of the electrostatic chuck ESC and the central position of the measuring instrument 100 can be obtained.

As described above, the exemplary measuring instrument 100 can obtain the misalignment amount between the central position of the edge ring ER and the central position of the measuring instrument 100, and the misalignment amount between the central position of the electrostatic chuck ESC and the central position of the measuring instrument 100. In this case, the misalignment amount between the central position of the electrostatic chuck ESC and the central position of the edge ring ER may be obtained. The misalignment amount may be a composite vector of the misalignment amount between the central position of the edge ring ER and the central position of the measuring instrument 100 and the misalignment amount between the central position of the electrostatic chuck ESC and the central position of the measuring instrument 100.

Figure 11:
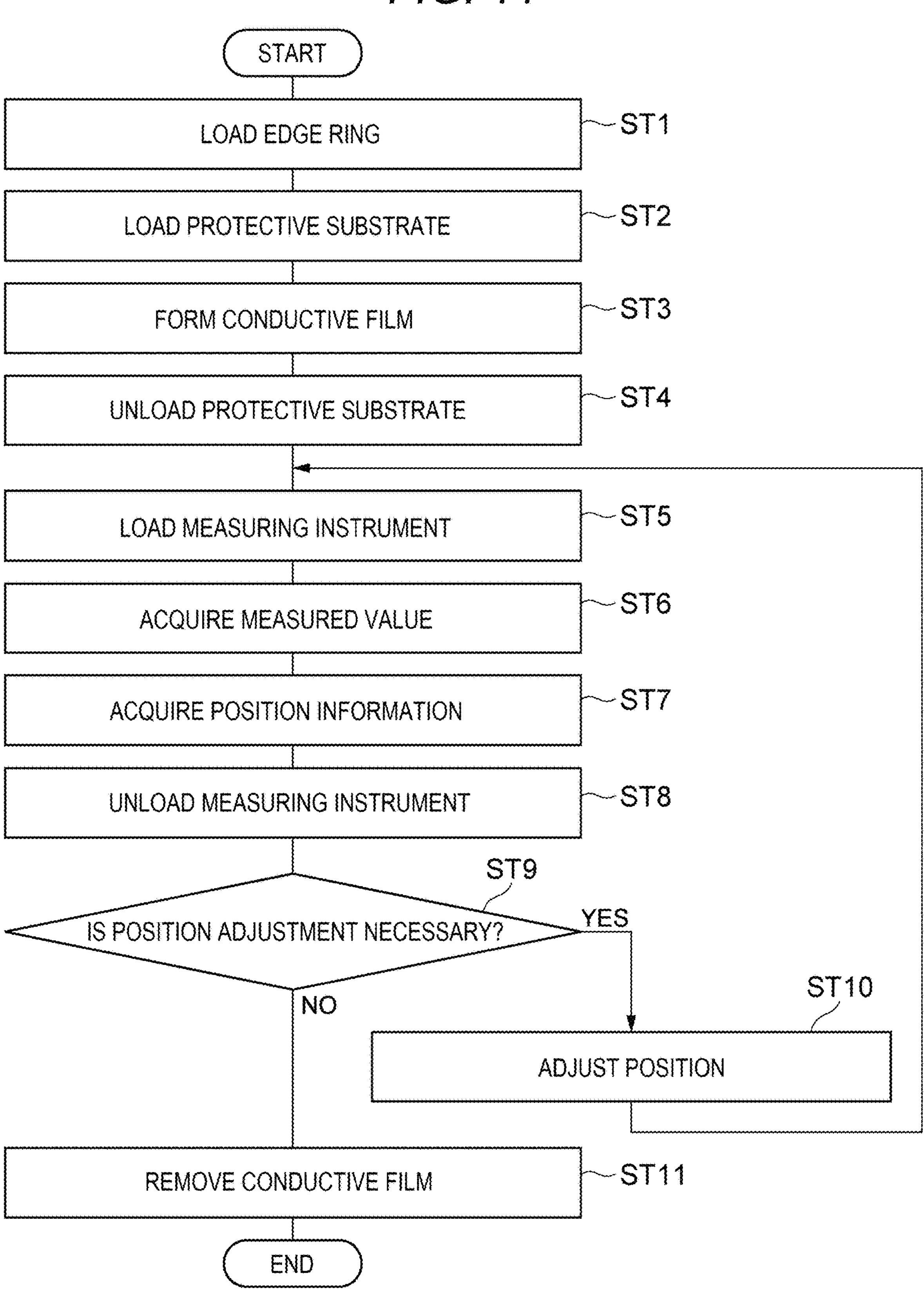
FIG. 11 is a flowchart illustrating an example of a measurement method using the measuring instrument.

Hereinafter, a measurement method of the capacitance using the measuring instrument 100 will be described. FIG. 11 illustrates a series of flow of a measurement method according to an exemplary embodiment. In the method illustrated in FIG. 11, a flow of a case where the capacitance between the sensor electrodes 143 and the edge ring ER having the conductive film F is obtained using the edge ring body ER1 on which the conductive film F is not formed in an initial state is shown. In a semiconductor manufacturing apparatus such as the processing system 1, since the edge ring wears by use, it is necessary to periodically replace the edge ring. When replacing the edge ring, it is important to dispose the workpiece W and the edge ring in an optimal positional relationship in order to stabilize productivity. When confirming an installation position of the replaced edge ring, it is generally necessary to open the chamber. Therefore, the replacing operation may be complicated. Therefore, it is desired to accurately transport the edge ring by a simple method.

As described above, the controller MC controls the transport device TU2 in the processing system 1. In one exemplary embodiment, the transport device TU2 may transport the edge ring ER or the edge ring body ER1 onto the second plate 18*b* based on transport position data transmitted from the controller MC. Further, the transport device TU2 may transport the workpiece W and the measuring instrument 100 onto a placement region R of the electrostatic chuck ESC based on the transport position data transmitted from the controller MC.

In an example, any of the process modules PM1 to PM6 may be used as a storage location for the edge ring ER or the edge ring body ER1. As described, the process modules PM1 to PM6 are connected to the transfer module TF in an airtight manner through gate valves. In this case, the edge ring ER or the edge ring body ER1 can be replaced by the transport device TU2 without exposing the process module to the atmosphere.

In the measurement method illustrated in FIG. 11, first, step ST1 is performed. In step ST1, the edge ring body ER1 having no conductive film F formed on its surface is loaded into the process module. For example, the transport device TU2 transports the edge ring body ER1 onto the second plate 18*b* in the chamber S such that the electrostatic chuck ESC is located inside the region surrounded by the edge ring body ER1. The edge ring body ER1 is transported by the transport device TU2 based on the transport position data in a state of being placed on the transport arm Tua. The transport position data may be coordinate data determined in advance such that the central position of the edge ring body ER1 coincides with the central position of the electrostatic chuck ESC, for example. The transported edge ring body ER1 is supported by the lift pins 27*a* and is placed to surround the electrostatic chuck ESC along with the descent of the lift pins 27*a*.

Figure 12:
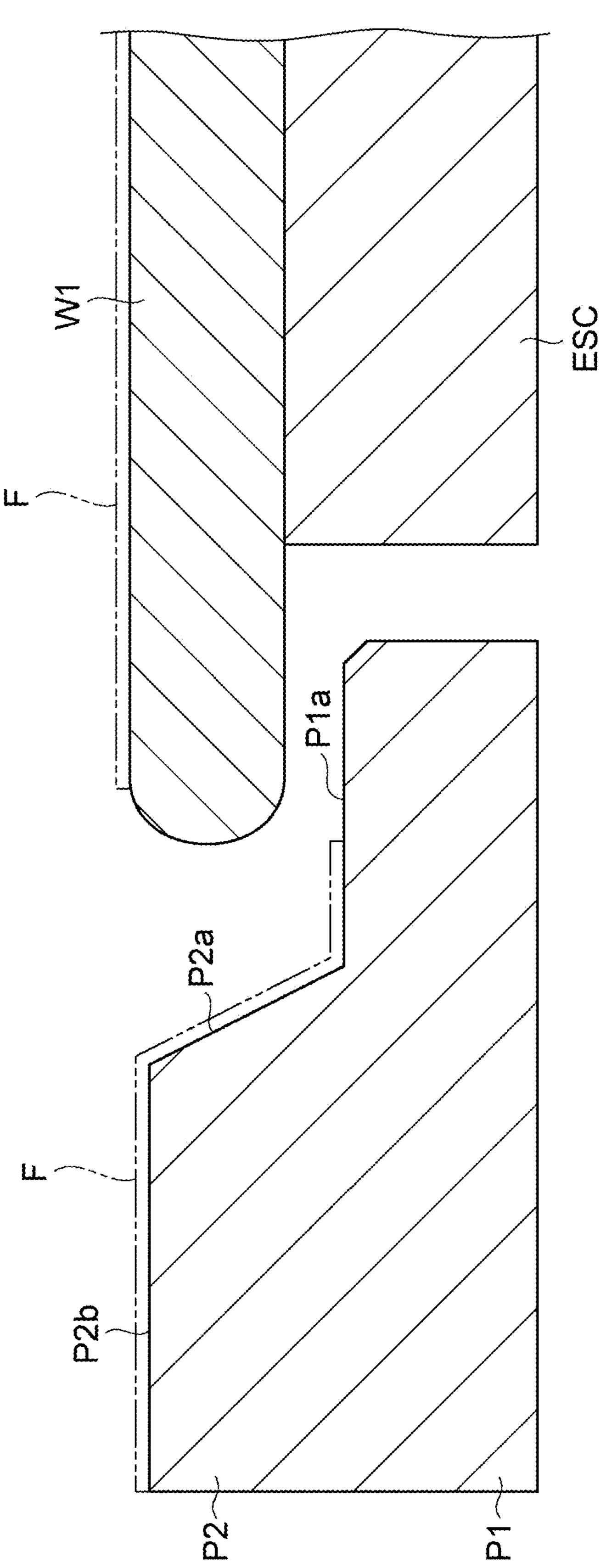
FIG. 12 is a schematic cross-sectional view illustrating a state where a conductive film is formed on the edge ring.

In subsequent step ST2, a covering member is placed on the region on the stage ST that is surrounded by the edge ring body ER1. For example, a protective substrate W1 serving as a covering member is transported onto the electrostatic chuck ESC, which is an inner region of the edge ring body ER1 transported in step ST1. FIG. 12 illustrates a state where the protective substrate W1 is placed on the electrostatic chuck ESC on the inner side of the edge ring body ER1. In a state where the protective substrate W1 is placed on the electrostatic chuck ESC, the entire upper surface of the electrostatic chuck ESC is covered with the protective substrate W1. Further, an inner portion of the upper surface P1*a* of the first part P1 of the edge ring body ER1 is covered with the protective substrate W1 when viewed from above.

The protective substrate W1 may be, for example, a bare silicon substrate having substantially the same shape as the measuring instrument 100. For example, the transport device TU1 transports the protective substrate W1 to one of the load-lock module LL1 and the load-lock module LL2. Based on the transport position data, the transport device TU2 transports the protective substrate W1 from the one of load-lock module to the process module, and places the protective substrate W1 on the electrostatic chuck ESC in the chamber S. The transport position data is coordinate data determined in advance such that a position of the central axis of the protective substrate W1 coincides with the central position of the electrostatic chuck ESC, for example. Similar to the case of the edge ring body ER1, any of the process modules PM1 to PM6 may be used as a storage location for the protective substrate W1.

In subsequent step ST3, the conductive film F is formed on the surface of the edge ring body ER1 placed on the second plate 18*b*. In step ST3, the conductive film F is formed by plasma CVD. In step ST3 in which the plasma CVD is used, a film-forming gas is supplied into the chamber S, and a plasma is generated from the film-forming gas within the chamber S. In this case, the controller MC controls the flow rate controller group 44 and the like connected to the gas source group 40 to supply the film-forming gas into the chamber S. Further, the controller MC controls the exhaust device 50 to set the pressure in the chamber S to a designated pressure. The controller MC may control the first radio-frequency power supply 62 to supply radio-frequency power to generate a plasma from the film-forming gas. For example, the frequency of the supplied radio-frequency power may be about 10 MHz to 100 MHz.

The film-forming gas may be, for example, a hydrocarbon gas, a hydrofluorocarbon gas, a fluorocarbon gas, or combinations thereof. Further, the film-forming gas may further contain a rare gas of He, Ne, Ar, Kr, or Xe for pressure control. The pressure of the film-forming gas may be set to, for example, 0.1 Torr or more. For example, in step ST3, a hydrocarbon gas and a rare gas are supplied as a film-forming gas into the chamber S and a plasma is generated from the supplied film-forming gas, thereby forming the conductive film F, which is an organic film having conductivity, inside the chamber S. For example, during the crystal growth of carbon, the crystallinity is disturbed by the carbon atom not incorporated in the crystal orientation, and amorphous carbon as an amorphous portion is generated. Due to this amorphous portion, the formed film exhibits conductivity.

The rare gas contained in the film-forming gas easily maintains glow discharge, realizes a uniform and stable plasma, and may contribute to the formation of a low resistance organic film. Further, when a fluorocarbon gas or a hydrofluorocarbon gas is added to the film-forming gas, the conductive film having higher conductivity can be formed by separating hydrogen by a scavenging effect of hydrogen by fluorine.

Further, the conductivity of the organic film to be formed depends on a hydrogen concentration in the film. By raising the temperature of the edge ring body ER1 and separating the hydrogen, the conductive film F having higher conductivity can be formed. In an example, the stage ST may be provided with a temperature control mechanism that includes a heater or the like for adjusting the temperature of the edge ring body ER1.

In the example in FIG. 12, the conductive film F is formed on an upper surface of the protective substrate W1, the upper surface P2*b* and the inner peripheral surface P2*a* of the second part P2 of the edge ring body ER1, and a portion of the upper surface P1*a* of the first part P1 that is not covered with the protective substrate W1. Through the processes of steps ST1 to ST3, the edge ring ER having the conductive film F is held on the second plate 18*b*. After step ST3, a purging process may be performed. In the purging process, after a purge gas is supplied into the chamber S, the purge gas is exhausted. The purge gas is, for example, an inert gas of nitrogen or argon.

In subsequent step ST4, the protective substrate W1 is unloaded from the region surrounded by the edge ring ER on the stage ST (that is, on the electrostatic chuck ESC). That is, in step ST4, the protective substrate W1 is unloaded from the process module and returned to any of the transfer module TF, the load-lock modules LL1 and LL2, the loader module LM, and the containers 4*a* to 4*d*.

In subsequent step ST5, the measuring instrument 100 is transported onto the electrostatic chuck ESC, which is a region surrounded by the edge ring ER on the stage ST. Specifically, the transport device TU1 transports the measuring instrument 100 to one of the load-lock module LL1 and the load-lock module LL2. Based on the transport position data, the transport device TU2 transports the measuring instrument 100 from the one of load-lock module to the process module, and places the measuring instrument 100 on the electrostatic chuck ESC. The transport position data is, for example, coordinate data determined in advance such that the position of the central axis AX100 of the measuring instrument 100 coincides with the central position of the electrostatic chuck ESC. Similar to the case of the edge ring body ER1, any of the process modules PM1 to PM6 may be used as a storage location for the measuring instrument 100.

In subsequent step ST6, the transported measuring instrument 100 acquires measured values indicating the capacitances between the sensor electrodes 143 and the edge ring ER having the conductive film F. Specifically, the measuring instrument 100 acquires digital values (measured values) corresponding to the magnitude of the capacitances between the edge ring ER (the inner peripheral surface P2*a*) and the sensor electrodes 143 of the first sensors 104A to 104C, and stores the digital values in the storage device 175. Further, the measuring instrument 100 acquires digital values (measured values) corresponding to the magnitude of the capacitances between the electrostatic chuck ESC and the sensor electrodes 161 of the second sensors 105A to 105C, and stores the digital values in the storage device 175. The digital values may be obtained at predetermined timings under the control of the processor 174.

In subsequent step ST7, position information is obtained based on the measured values measured in step ST6. The position information may be a misalignment amount between the central position of the edge ring ER and the central position of the measuring instrument 100, a misalignment amount between the central position of the electrostatic chuck ESC and the central position of the measuring instrument 100, or a misalignment amount between the central position of the electrostatic chuck ESC and the central position of the edge ring ER. The position information may be a misalignment amount between the transport position data (coordinate data) of the measuring instrument 100 and the actual transport position of the measuring instrument 100. Further, the position information may be a misalignment amount between the transport position data (coordinate data) of the edge ring ER and the actual transport position of the edge ring ER. For example, in step ST7, the digital values stored in the storage device 175 are transmitted to the controller MC. The digital values may be transmitted from the communication device 176 to the controller MC in response to a command from the controller MC. Subsequently, the controller MC obtains the position information described above based on the received digital values. The position information may be obtained by the processor 174 of the measuring instrument 100. In this case, the obtained position information may be transmitted to the controller MC.

In subsequent step ST8, the measuring instrument 100 is unloaded from the process module, and returned to any of the transfer module TF, the load-lock modules LL1 and LL2, the loader module LM, and the containers 4*a* to 4*d*.

In subsequent step ST9, it is determined whether it is necessary to adjust the transport position by the transport devices TU1 and TU2. For example, the controller MC determines whether the misalignment amount between the transport position data (coordinate data) of the measuring instrument 100 and the actual transport position of the measuring instrument 100 exceeds a predetermined threshold. Further, the controller MC determines whether the misalignment amount between the transport position data (coordinate data) of the edge ring ER and the actual transport position of the edge ring ER exceeds a predetermined threshold. When it is determined that the misalignment amounts are equal to or less than the predetermined threshold, it is confirmed that the measuring instrument 100 and the edge ring ER are accurately transported. In this case, the process proceeds to subsequent step ST11. On the other hand, when it Is determined that the misalignment amount is larger than the threshold, the process proceeds to step ST10.

In step ST10, the transport position by the transport device is adjusted based on the measured values. For example, the transport position data of the edge ring ER is adjusted based on the misalignment amount derived in step ST7 such that the central position of the electrostatic chuck ESC and the central position of the edge ring ER coincide with each other. Then, based on the corrected transport position data, the edge ring ER is transported again by the transport device TU2 such that the central position of the edge ring ER coincides with the central position of the electrostatic chuck ESC. In this case, for example, the edge ring ER is temporarily unloaded from the second plate 18*b* into the process module used as a storage location. Then, the edge ring ER is supported again by the transport arm tUa, and the edge ring ER is transported onto the second plate 18*b*. In the position adjustment of the edge ring ER, the edge ring ER may not be returned to the storage location. For example, the transport position of the edge ring ER may be adjusted by supporting the edge ring by the transport arm tUa and moving the transport arm tUa by a third misalignment amount. In step ST10, the transport position data of the measuring instrument 100 is adjusted based on the misalignment amount derived in step ST7, such that the central position of the electrostatic chuck ESC and the central position of the measuring instrument 100 coincide with each other. Then, the process returns to step ST5 again.

In subsequent step ST11, the conductive film F formed on the edge ring ER is removed (e.g., ashed) by a plasma containing an oxygen atom. In step ST11, the removal gas is supplied into the chamber S, and a plasma is generated from the removal gas within the chamber S. In this case, the controller MC controls the flow rate controller group 44 and the like connected to the gas source group 40 to supply the removal gas into the chamber S. Further, the controller MC controls the exhaust device 50 to set the pressure in the chamber S to a designated pressure. The controller MC may control the first radio-frequency power supply 62 to supply radio-frequency power to generate a plasma from the removal gas. The removal gas may be, for example, an oxygen gas ($O_2$). Since the transport position data used by the transport device is in a calibrated state after step ST11 is completed, the workpiece W can be accurately transported to the predetermined position on the electrostatic chuck ESC after the protective substrate W1 is unloaded. When step ST11 is performed, the protective substrate W1 may be loaded into the region on the stage ST that is surrounded by the edge ring ER. The protective substrate W1 to be loaded may be the protective substrate W1 transported in step ST4, or may be another protective substrate W1 having no conductive film F formed on the surface thereof.

As described above, in one exemplary embodiment, the measurement method of acquiring the measured value indicating the capacitance between the measuring instrument 100 and the edge ring ER in the chamber S of the processing system 1 is provided. The processing system 1 includes the process module PM, the transport devices TU1 and TU2, and the controller MC. The process module PM includes the chamber main body 12 that provides the chamber S. The process module PM includes the stage ST provided in the chamber S. The measuring instrument 100 is placed on the stage ST. The transport devices TU1 and TU2 transport the measuring instrument 100 into the chamber S. The controller MC controls the operations of the transport devices TU1 and TU2. The measuring instrument 100 includes the base substrate 102 and the sensor electrodes 143. The base substrate 102 has a disc shape. The sensor electrodes 143 are provided on the base substrate 102. The method includes holding, on the stage ST, the edge ring ER having the conductive film F formed on at least a part of a surface thereof. The method includes transporting the measuring instrument 100 to a region on the stage ST that is surrounded by the edge ring ER. The method includes acquiring measured values indicating a capacitance between the measuring instrument 100 and the edge ring ER by using the measuring instrument 100 transported to the inner side of the region, the edge ring ER having the conductive film F.

Further, in one exemplary embodiment, a measurement system is provided that acquires a measured value indicating the capacitance between the measuring instrument 100 and the edge ring ER in the chamber S of the processing system 1. The measuring instrument 100 includes the base substrate 102, the sensor electrodes 143, and the processor 174. The base substrate 102 has a disc shape. The sensor electrodes 143 are provided on the base substrate 102 to face outward in the radial direction. Based on the digital values output from the A/D converter 173, the processor 174 calculates the measured values indicating the capacitances respectively formed by the sensor electrodes 143. The processing system 1 includes the process module PM, the transport devices TU1 and TU2, and the controller MC. The process module PM includes the chamber main body 12 that provides the chamber S. The process module PM includes the stage ST provided in the chamber S. The measuring instrument 100 is placed on the stage ST. The transport devices TU1 and TU2 transport the measuring instrument 100 into the chamber S. The controller MC controls the operations of the transport devices TU1 and TU2. The edge ring ER having the conductive film F formed on at least a part of the surface thereof is held on the stage ST. The controller MC controls the transport devices TU1 and TU2 such that the measuring instrument 100 is transported to the region on the stage ST that is surrounded by the edge ring ER. The processor 174 calculates the measured values indicating the capacitances between the sensor electrodes 143 of the measuring instrument 100 transported to the inner side of the region and the edge ring ER having the conductive film F.

In the measurement method and the measurement system of the embodiment described above, the measured values indicating the capacitances corresponding to the distances between the sensor electrodes 143 of the measuring instrument 100 transported to the region surrounded by the edge ring ER and the edge ring ER are acquired by the measuring instrument 100. For example, when the dielectric constant of the material forming the edge ring body ER1 is small, the capacitance between the sensor electrode 143 and the edge ring body ER1 tends to have a low value. In this case, a change in capacitance caused by a change in distance is also small. In the measurement method and the measurement system of the embodiment described above, the surface of the edge ring body ER1 has the conductive film F when the measured value is obtained. Since the sensor electrodes 143 and the conductive film F of the edge ring ER face each other, the capacitance measured by the measuring instrument 100 is the capacitance between the sensor electrode 143 and the conductive film F. Since both the sensor electrode 143 and the conductive film F are conductors having a large dielectric constant, the measured value obtained by the measuring instrument 100 is large. Therefore, the capacitance having a magnitude corresponding to the distance between the sensor electrode 143 and the edge ring ER is appropriately obtained.

In one exemplary embodiment, the edge ring body ER1 is formed of an insulator such as quartz. As described above, even when the edge ring body ER1 is formed of an insulator, since the conductive film F is formed on the surface thereof, a large value of the capacitance is obtained.

In one exemplary embodiment, the conductive film F is a carbon-based film containing a carbon atom. In this case, after the measurement of the capacitance is completed, the conductive film can be easily removed through plasma etching or the like.

In one exemplary embodiment, the holding the edge ring ER on the stage ST includes placing the edge ring body ER1 on the stage ST. Further, the holding the edge ring ER on the stage ST includes forming the conductive film F on the surface of the edge ring body ER1 placed on the stage ST. Since the conductive film F can be formed on the edge ring body ER1 on the stage ST, it is not necessary to prepare in advance the edge ring ER on which the conductive film F is formed.

In one exemplary embodiment, the forming the conductive film F may be forming the conductive film F by CVD. In this case, the CVD may be plasma CVD. For example, the conductive film F can be formed to have a uniform thickness in the circumferential direction of the edge ring body ER1.

In one exemplary embodiment, the forming the conductive film F may be forming the conductive film F by a plasma of a hydrocarbon gas, a hydrofluorocarbon gas, a fluorocarbon gas, or a gas including combinations thereof. In this case, the conductive film F can be formed with stable quality.

In one exemplary embodiment, the method includes, before the forming the conductive film F, placing the protective substrate W1 on the region (in an example, the electrostatic chuck ESC) surrounded by the edge ring body ER1 on the stage ST. Further, the method includes, after the forming the conductive film F, removing the protective substrate W1 from the region surrounded by the edge ring ER on the stage ST. Since the conductive film is formed after the protective substrate W1 is transported, the formation of the conductive film on the upper surface of the electrostatic chuck ESC is restricted.

In one exemplary embodiment, the method may further include, after the acquiring the measured values, removing the conductive film F by a plasma containing an oxygen atom. By removing the conductive film F, the edge ring body ER1 can be used as usual.

In one exemplary embodiment, the conductive film F is formed at least on a portion of the edge ring body ER1 that faces the sensor electrodes 143 of the measuring instrument 100. With this configuration, the conductive film F and the sensor electrode 143 surely face each other when measuring the capacitance.

In one exemplary embodiment, the method includes, after the acquiring the measured values, adjusting a transport position of the transport devices TU1 and TU2 based on the measured values. For example, the transport position data is calibrated to accurately transport the workpiece W to the central position of the electrostatic chuck ESC.

In one exemplary embodiment, the measuring instrument 100 includes the radio frequency oscillator 171, the C/V conversion circuits 172, the A/D converter 173, and the processor 174. The base substrate 102 has a disc shape. The sensor electrodes 143 are provided on the base substrate 102. The radio frequency oscillator 171 is provided to supply a radio frequency signal to the sensor electrodes 143. The C/V conversion circuits 172 generate voltage signals corresponding to the respective capacitances formed by the respective sensor electrodes 143. The A/D converter 173 converts the voltage signals output from the respective C/V conversion circuits 172 into digital values, respectively. Based on the digital values output from the A/D converter 173, the processor 174 calculates the measured values indicating the capacitances respectively formed by the sensor electrodes 143. With this configuration, the measured value indicating the capacitance can be easily acquired by the measuring instrument 100 alone.

While various exemplary embodiments have been described above, various omissions, substitutions, and changes may be made without being limited to the exemplary embodiments described above.

For example, in the holding the edge ring ER on the stage ST, the conductive film F may be formed on the surface of the edge ring body ER1 on the stage ST, or the edge ring ER on which the conductive film F is formed in advance may be transported onto the stage ST. When forming the conductive film F in advance on the surface of the edge ring body ER1, for example, the conductive film F may be formed only on the inner peripheral surface P2*a* of the edge ring body ER1. Further, the conductive film F may be formed only on the inner peripheral surface P2*a* and the upper surface P2*b* of the edge ring body ER1.

Further, for example, it is conceivable to embed a conductive member in a ring shape along the circumferential direction inside the edge ring body ER1. When such an edge ring is used, the measuring instrument 100 can measure a capacitance between the conductive member embedded in the edge ring and the sensor electrode 143. In this case, even if a conductive film is not formed on the surface of the edge ring, the measured value obtained by the measuring instrument 100 may be large.

In the flow illustrated in FIG. 11, the position adjustment is performed immediately when it is determined that the position adjustment is necessary as a result of the measurement performed by the measuring instrument 100. Alternatively, the position adjustment may be further performed in a later process. For example, after the measurement performed by the measuring instrument 100, the conductive film may be removed before executing the position adjustment. In this case, the position adjustment of the edge ring body from which the conductive film is removed is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A measurement method, the method comprising:
providing a processing system including:
a process module including a chamber main body and a stage, the chamber main body including a chamber, the stage being provided in the chamber and on which a measuring instrument is to be placed;
a transport device configured to transport the measuring instrument into the chamber, the transport device being an articulated robot; and
controller circuitry configured to control an operation of the transport device, the measuring instrument including:
a disc-shaped base substrate; and
sensor electrodes provided on the disc-shaped base substrate and facing outward in a radial direction,
holding an edge ring on the stage;
transporting the measuring instrument to a region surrounded by the edge ring on the stage; and
acquiring measured values indicating capacitances between the sensor electrodes and the edge ring by using the measuring instrument transported to an inner side of the region, wherein
the edge ring includes an edge ring body and a conductive film, the conductive film being formed on at least a part of a surface of the edge ring body and the conductive film having a composition different from a composition of the edge ring body in composition.

2. The measurement method according to claim 1, wherein the measuring instrument includes a circuit substrate calculating the measured values.

3. The measurement method according to claim 1, wherein the edge ring body is formed of an insulator.

4. The measurement method according to claim 1, wherein the conductive film contains carbon.

5. The measurement method according to claim 1, wherein the holding the edge ring on the stage includes placing the edge ring body on the stage and forming the conductive film on the surface of the edge ring body while the edge ring body remains on the stage.

6. The measurement method according to claim 5, wherein the conductive film is formed by chemical vapor deposition (CVD).

7. The measurement method according to claim 6, wherein the CVD is plasma CVD.

8. The measurement method according to claim 7, wherein the plasma CVD includes forming the conductive film by a plasma of a hydrocarbon gas, a hydrofluorocarbon gas, a fluorocarbon gas, or a gas including combinations thereof.

9. The measurement method according to claim 7, further comprising:
before the forming the conductive film, placing a covering member on the region surrounded by the edge ring body on the stage; and
after the forming the conductive film, removing the covering member from the region surrounded by the edge ring on the stage.

10. The measurement method according to claim 7, further comprising:
after the acquiring the measured values, removing the conductive film by a plasma containing oxygen.

11. The measurement method according to claim 1, wherein the conductive film is formed on at least a part of the edge ring body that faces the sensor electrodes of the measuring instrument.

12. The measurement method according to claim 1, further comprising:
after the acquiring the measured values, adjusting a transport position of the transport device based on the measured values.

13. The measurement method according to claim 1, wherein the measuring instrument includes:
a radio frequency oscillator supplying a radio frequency signal to the sensor electrodes;
capacitance-to-voltage (C/V) conversion circuits generating voltage signals corresponding to respective capacitances formed by the respective sensor electrodes;
an analog to digital (A/D) converter converting the voltage signals output from the respective C/V conversion circuits into digital values, respectively; and
arithmetic circuitry calculating the measured values indicating the capacitances respectively formed by the sensor electrodes, based on the digital values output from the A/D converter.

14. A measurement system, the measurement system comprising:
a measuring instrument including
a disc-shaped base substrate,
sensor electrodes provided on the disc-shaped base substrate and facing outward in a radial direction, and
arithmetic circuitry configured to calculate measured values indicating capacitances respectively formed by the sensor electrodes; and
a processing system including
a process module including a chamber main body and a stage, the chamber main body including a chamber, the stage being provided in the chamber and on which the measuring instrument is to be placed;
a transport device configured to transport the measuring instrument into the chamber, the transport device being an articulated robot; and
controller circuitry configured to control an operation of the transport device, wherein
the stage is configured to hold an edge ring,
the controller circuitry is configured to control the transport device to transport the measuring instrument to a region surrounded by the edge ring on the stage,
the arithmetic circuitry is configured to calculate the measured values indicating the capacitances between the sensor electrodes of the measuring instrument transported to an inner side of the region and the edge ring, and the edge ring includes an edge ring body and a conductive film, the conductive film being formed on at least a part of a surface of the edge ring body and the conductive film having a composition different from a composition of the edge ring body.

15. The measurement system according to claim 14, wherein the arithmetic circuitry includes a circuit substrate configured to calculate the measured values.

16. The measurement system according to claim 14, wherein the conductive film is configured to be formed on the surface of the edge ring body while the edge ring body remains on the stage.

17. The measurement system according to claim 16, wherein the conductive film is formed by plasma chemical vapor deposition (CVD), including by plasma of a hydrocarbon gas, a hydrofluorocarbon gas, a fluorocarbon gas, or a gas including combinations thereof.

18. The measurement system according to claim 14, wherein the conductive film is formed on at least a part of the edge ring body that faces the sensor electrodes of the measuring instrument.

19. The measurement system according to claim 14, wherein a transport position of the transport device is configured to be adjusted based on the measured values.

20. The measurement system according to claim 14, wherein the measuring instrument further includes:

a radio frequency oscillator configured to supply a radio frequency signal to the sensor electrodes;

capacitance-to-voltage (C/V) conversion circuits configured to generate voltage signals corresponding to respective capacitances formed by the respective sensor electrodes;

an analog to digital (A/D) converter configured to convert the voltage signals output from the respective C/V conversion circuits into digital values, respectively; and the arithmetic circuitry configured to calculate the measured values indicating the capacitances respectively formed by the sensor electrodes, based on the digital values output from the A/D converter.

* * * * *